US006900462B2

(12) United States Patent
Suzawa et al.

(10) Patent No.: US 6,900,462 B2
(45) Date of Patent: May 31, 2005

(54) SEMICONDUCTOR DEVICE AND MANUFACTURING METHOD THEREOF

(75) Inventors: Hideomi Suzawa, Kanagawa (JP); Yoshihiro Kusuyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/683,545

(22) Filed: Oct. 10, 2003

(65) Prior Publication Data

US 2004/0140471 A1 Jul. 22, 2004

Related U.S. Application Data

(62) Division of application No. 10/189,935, filed on Jul. 3, 2002, now Pat. No. 6,686,228, which is a continuation of application No. 09/535,835, filed on Mar. 28, 2000, now Pat. No. 6,475,836.

(30) Foreign Application Priority Data

Mar. 29, 1999 (JP) .......................................... 11-087017

(51) Int. Cl.[7] ........................ H01L 29/04; H01L 31/20; H01L 31/036; H01L 31/0376

(52) U.S. Cl. ........................................................ 257/59

(58) Field of Search ........................... 257/59, 60, 330, 257/368, 365, 366, 347

(56) References Cited

U.S. PATENT DOCUMENTS

| | | | | |
|---|---|---|---|---|
| 5,477,359 A | * | 12/1995 | Okazaki | 349/130 |
| 5,594,569 A | | 1/1997 | Konuma et al. | 349/122 |
| 5,643,826 A | | 7/1997 | Ohtani et al. | 437/88 |
| 5,922,125 A | | 7/1999 | Zhang | 117/9 |
| 5,923,962 A | | 7/1999 | Ohtani et al. | 438/150 |
| 5,952,708 A | | 9/1999 | Yamazaki | 257/643 |
| 6,115,090 A | | 9/2000 | Yamazaki | 349/42 |
| 6,160,272 A | | 12/2000 | Arai et al. | 257/72 |
| 6,169,293 B1 | | 1/2001 | Yamazaki | 257/72 |
| 6,195,139 B1 | * | 2/2001 | Yamazaki et al. | 349/43 |
| 6,204,081 B1 | * | 3/2001 | Kim et al. | 438/30 |
| 6,218,206 B1 | * | 4/2001 | Inoue et al. | 438/30 |
| 6,225,645 B1 | | 5/2001 | Zhang | 257/59 |
| 6,239,470 B1 | | 5/2001 | Yamazaki | 257/350 |
| 6,295,109 B1 | * | 9/2001 | Kubo et al. | 349/119 |
| 6,475,836 B1 | | 11/2002 | Suzawa et al. | 438/149 |

FOREIGN PATENT DOCUMENTS

| | | |
|---|---|---|
| JP | 7-130652 | 5/1995 |
| JP | 10-247735 | 9/1998 |
| JP | 10-294280 | 11/1998 |
| JP | 11-097702 | 4/1999 |
| JP | 11-133463 | 5/1999 |
| JP | 11-191628 | 7/1999 |
| JP | 11-345767 | 12/1999 |
| JP | 11-354442 | 12/1999 |

OTHER PUBLICATIONS

Inui, S. et al, "Thresholdless Antiferroelectricity in Liquid Crystals and its Application to Displays, " J. Mater. Chem., vol. 6, No. 4, pp. 671–673, (1996).
Yoshida, T. et al, "A Full–Color Thresholdless Antiferroelectric LCD Exhibiting Wide Viewing Angle with Fast Response Time," SID 97 Digest, pp. 841–844, (1997).
Furue, H. et al, "Characteristics and Driving Scheme of Polymer–Stabilized Monostable FLCD Exhibiting Fast Response Time and High Contrast Ratio with Gray–Scale Capability," SID 98 Digest, pp. 782–785, (1998).
Shimokawa, R. et al, "Characterization of High–Efficiency Cast–Si Solar Cell Wafers by MBIC Measurement," Japanese Journal of Applied Physics, vol. 27, No. 5, pp. 751–758, May, (1988).

* cited by examiner

*Primary Examiner*—David Nhu
(74) *Attorney, Agent, or Firm*—Cook, Alex, McFarron, Manzo, Cummings & Mehler, Ltd.

(57) ABSTRACT

It is an object of the present invention to provide a manufacturing method of semiconductor device whereby the number of processes is decreased due to simultaneously forming a contact hole in a lamination film of different material and film thickness (inorganic insulating film and organic resin film) by conducting etching once. By setting the selective ratio of dry etching (etching rate of organic resin film 503/etching rate of inorganic insulating film 502 containing nitrogen) from 1.6 to 2.9, preferably 1.9, the shape and the size of the contact holes to be formed even in a film of different material and film thickness can be nearly the same in both of the contact holes.

26 Claims, 22 Drawing Sheets

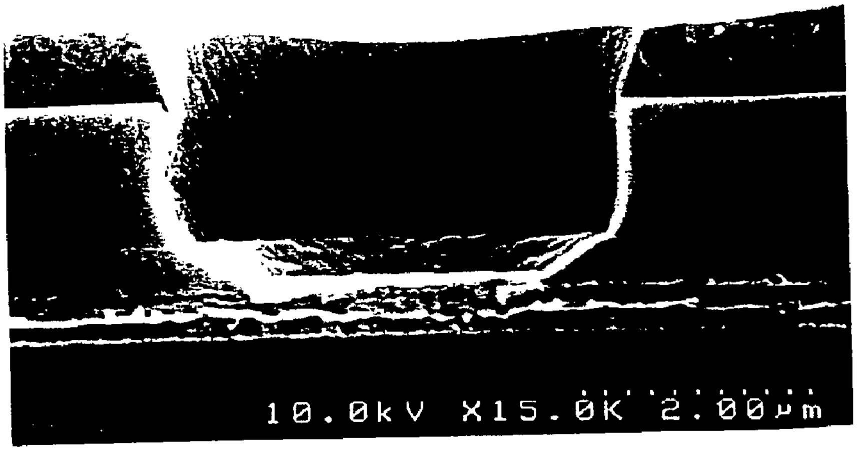
FIG. 3A $CF_4/O_2 = 40/60$
FIG. 3B $CF_4/O_2 = 45/55$
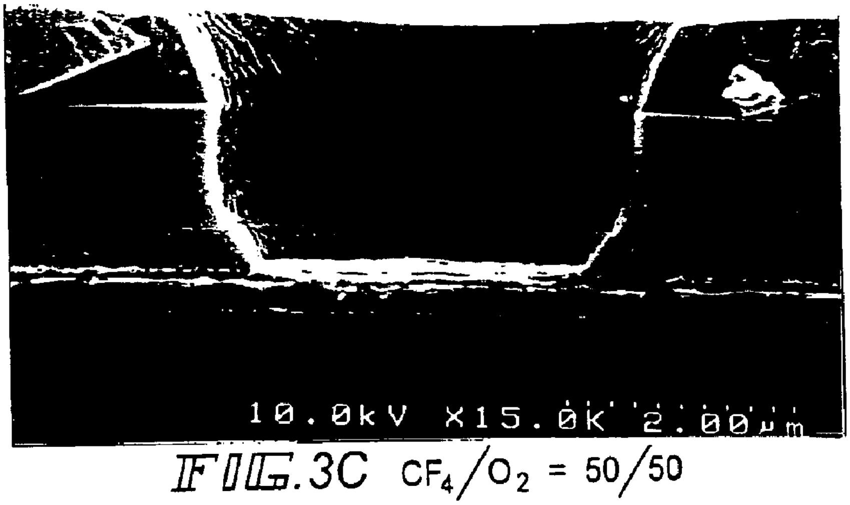
FIG. 3C $CF_4/O_2 = 50/50$

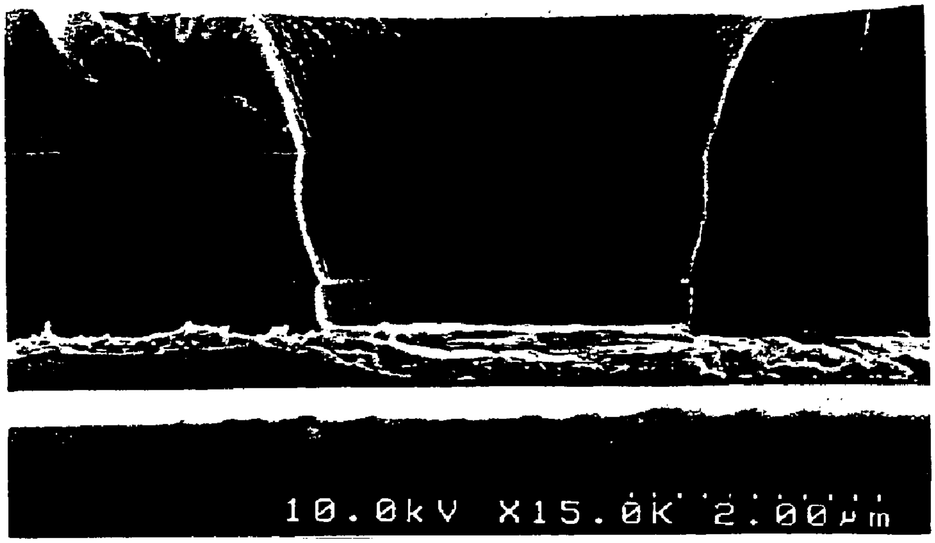
FIG. 4A $CF_4/O_2$ = 55/45
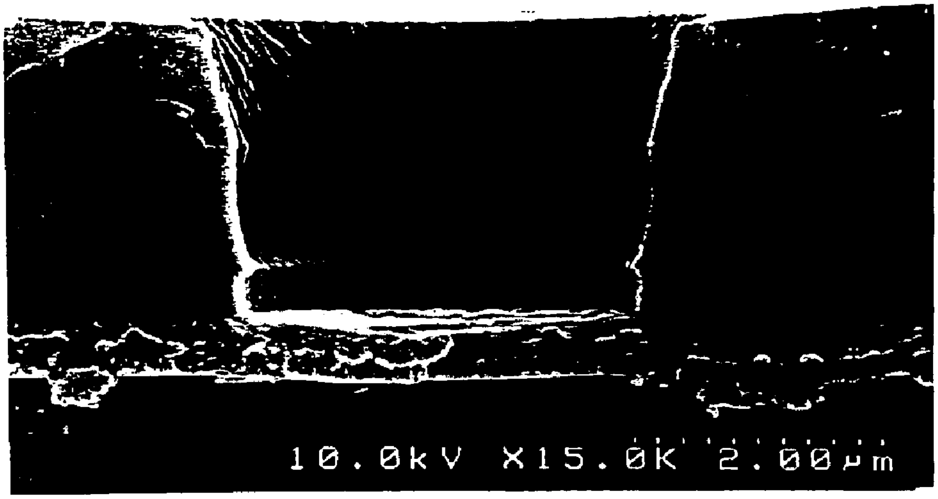
FIG. 4B $CF_4/O_2$ = 60/40

PROJECTION DEVICE
(THREE PLATE TYPE)

LIGHT SOURCE
OPTICAL SYSTEM

SEMICONDUCTOR DEVICE AND MANUFACTURING METHOD THEREOF

This application is a divisional of Ser. No. 10/189,935, Jul. 3, 2002 U.S. Pat. No. 6,686,228 which is a con of Ser. No. 09/535,835, Mar. 28, 2000, U.S. Pat. No. 6,475,836.

BACKGROUND OF THE INVENTION

1. Field of the Invention

The present invention relates to a semiconductor device having a circuit in which a thin film transistor (hereinafter referred to as TFT) is formed on a substrate having an insulating surface, and to a manufacturing method thereof. More particularly, the present invention relates to an electro-optical device typically known as a liquid crystal display device provided with an excellent-shaped contact hole, and to electronic equipment with an electro-optical device. Moreover, the semiconductor device according to the present invention refers to all equipment utilizing the semiconductor characteristics for functioning. The above electro-optical device and the electronic equipment with an electro-optical device are also included in semiconductor devices.

2. Description of the Related Art

The development of a semiconductor device having a large-area integrated circuit formed by the TFT (thin film transistor) on its insulating surface is under progression. AN active matrix liquid crystal display device, an EL display device, a contact-type image sensor, and the like are known as representative examples.

The characteristics of the TFT are deteriorated and reliability is lowered when organic resin film is directly formed on the TFT provided on the insulating surface. To solve those problems, conventionally, a laminated organic resin film is formed on the TFT after the formation of an inorganic insulating film (also called passivation film).

The TFT is normally connected to wirings through a contact hole. Therefore, when the above inorganic insulating film is provided on the TFT, it is necessary to form a contact hole for connecting to the upper layer wiring in the inorganic insulating film and the organic resin film which covers a TFT gate electrode, a source electrode, or a drain electrode. For instance, the contact hole is formed for connecting a drain electrode of a pixel TFT with a pixel electrode in an active matrix liquid crystal display using TFT.

A conventional manufacturing process will be described with reference to FIGS. 17A through D. Shown here is an example of an active matrix liquid crystal display applied to this process. Although the pixel TFT is not shown for simplification, a first conductive film 11 is identical with a drain electrode of a pixel TFT or electrically connected thereto. Also not shown is that there is a single layer or a multiple layer of insulating film between a substrate 10 and the first conductive film 11.

Shown in FIG. 17A is a state where the first conductive film 11 identical with the drain electrode of a pixel TFT or electrically connected thereto is formed on the substrate 10 on which the pixel TFT is formed. An inorganic insulating film 12 and an organic resin film 13 formed in laminations are formed on top of the first conductive film 11.

And shown in FIG. 17B is a state where the first patterning is performed by using a resist mask 14 by way of photolithography, and a first contact hole is opened only in the organic resin film 13.

Subsequently, a second patterning is performed by using a resist mask 15 after removing the resist mask 14, and a second contact hole is opened only in the inorganic insulating film 12. This state is shown in FIG. 17C. Since the second contact hole is formed in the bottom portion of the first contact hole, the diameter of its opening is smaller than that of the first contact hole.

Shown in FIG. 17D next is a state where a pixel electrode 16, made of transparent conductive film, is formed after removing the resist mask 15.

As shown in FIG. 17D, in this way there is a step in the shape of the contact hole because it has been formed after the first and second patterning processes.

Additionally, besides the above conventional manufacturing method, another method is to perform patterning right after forming the inorganic insulating film, then form the organic resin film and perform patterning again to form a contact hole. Two patterning processes were also necessary even in this method.

Since the number of processes and masks has increased due to two patterning (organic resin film patterning and inorganic insulating film patterning) processes in the conventional method, this led to an increase in costs.

In the two patterning processes, each method uses different photo mask, and therefore poor contact occurred when the masks had not been overlapped in precision. Also, in the example of the conventional process shown in FIG. 17, fining of the contact hole is difficult. That is because considering the margin when overlapping, the opening diameter of the second contact hole that was opened in the second patterning is 1.5 to 2 times bigger than the opening diameter of the first contact hole opened in the first patterning process.

Furthermore, the shape of a conventional contact hole (of which an example is shown in FIG. 17D) is a complicated shape formed by overlapping two contact holes with different opening diameter. Thus, poor coverage has occurred on a second conductive film formed later.

SUMMARY OF THE INVENTION

A technique of the present invention is for solving the above problems, and therefore it is an object of the present invention to provide a manufacturing method of a semiconductor device whereby the number of processes is decreased due to simultaneously forming a contact hole in a lamination film (inorganic insulating film and organic resin film) of different material and film thickness by conducting etching once.

It is another object of the present invention to improve operating efficiency and reliability of a semiconductor device by providing a contact hole that is uniform in shape, and moreover an appropriate one.

It is still another further object of the present invention to form a pixel electrode of good coverage and to provide a structure for improving the yield of an active matrix type liquid crystal display device.

In order to solve the above problems, the present invention provides a semiconductor device comprising: a first conductive film formed on an insulating substrate; an inorganic insulating film covering said first conductive film; an organic resin film covering said inorganic insulating film; a contact hole that goes through said inorganic insulating film and said organic resin film; and a second conductive film formed on said organic resin film which is connected to said first conductive film at a bottom surface of said contact hole.

Further, according to the above structure, said contact hole is formed by performing one etching.

Still further, according to each structure of the above, an edge portion of an inorganic insulating film that comes in contact with a bottom surface of said contact hole is taper like having an angle range of 30° to 80° from a horizontal surface.

Further, according to each structure of the above, an edge portion of an organic resin film that comes in contact with said inorganic insulating film has an angle range of 50° to 90° from a horizontal surface.

Still further, according to each structure of the above, a TFT is electrically connected to said first conductive film.

Further, according to each structure of the above, said second conductive film is a pixel electrode.

According to each structure of the above, said inorganic insulating film is a silicon nitride film or a silicon oxide nitride film.

Moreover, in order to realize the above structure, the present invention provides a method of manufacturing a semiconductor device comprising the steps of: forming a first conductive film; forming an inorganic insulating film on said first conductive film; forming an organic resin film on said inorganic insulating film; forming a contact hole in a laminated film formed of said inorganic insulating film and said organic resin film in one process; and forming a second conductive film in said contact hole.

Further, according to the above structure, said process of forming a contact hole is performed by dry etching employing mixed gas containing fluorine-based etchant gas and oxygen gas.

Furthermore, according to the above structure, a selective ratio of an etching rate of said inorganic insulating film to an etching rate of said organic resin film is 1.6 to 2.9.

Still further, according to the above structure, said inorganic insulating film is a silicon nitride film or a silicon oxide nitride film.

BRIEF DESCRIPTION OF THE DRAWINGS

In the accompanying drawings:

FIGS. 3A–3C are photographic views showing the vicinity of contact holes of $CF_4/O_2$=40/60, 45/55, and 50/55;

FIGS. 4A–4B are photographic views showing the vicinity of contact holes of $CF_4/O_2$=55/45 and 60/40;

DETAILED DESCRIPTION OF THE PREFERRED EMBODIMENTS

A description of preferred embodiments of the present invention will be given with reference to FIGS. 1 through 7.

Figure 1A:
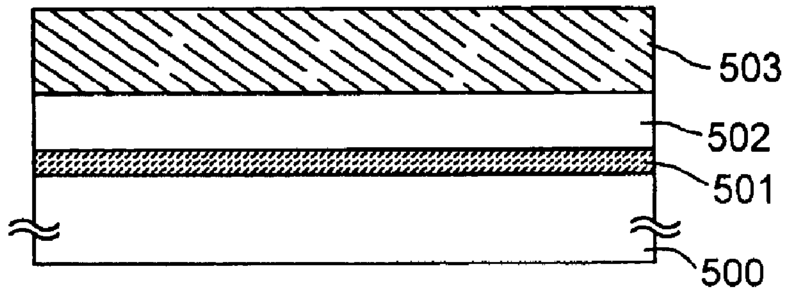
FIGS. 1A–1C are diagrams showing a manufacturing process of the present invention.
Figure 1B:
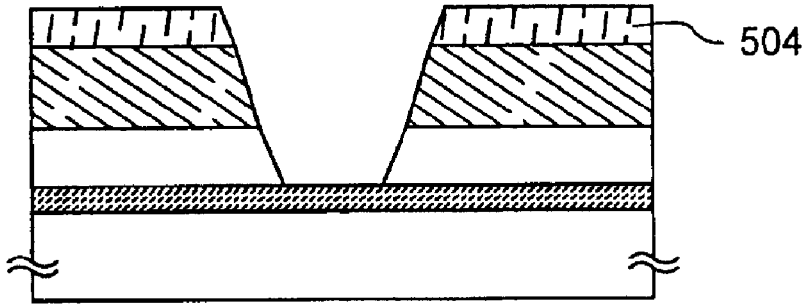
Figure 1C:
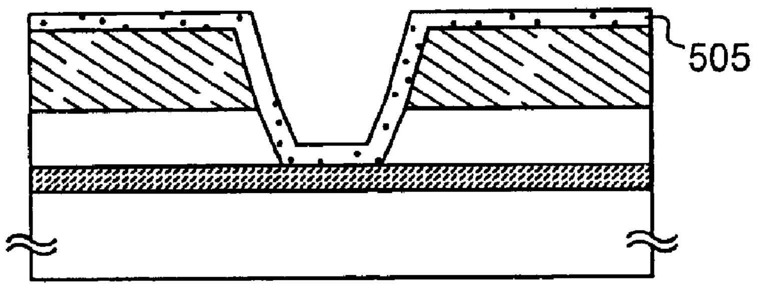

FIGS. 1A through 1C are diagrams showing a manufacturing process of the present invention.

First of all, a first conductive film 501, an inorganic insulating film 502, and an organic resin film 503 are formed in laminations on a substrate 500. (FIG. 1A)

After achieving the state illustrated in FIG. 1A, a resist mask 504 is formed by way of photolithography. Then, the opening of a contact hole is formed by simultaneously etching, only once, the lamination films of the inorganic insulating film 502 and the organic resin film 503 which are formed in laminations. (FIG. 1B) The etching conducted here is dry etching employing mixed gas, which contains oxygen and etchant gas that is at least fluorine-based.

The fluorine-based etchant gas as used herein indicates either fluorine or gas that partially contains fluorine. It also indicates, for example, simple substance gas such as $F_2$, $BF_3$, $SiF_4$, HF, $CF_4$, and the like or mixed gas. Moreover, it indicates gas obtained from the simple substance gas or mixed gas diluted by gases that do not contain chlorine (for example, $H_2$, $O_2$, $N_2$, etc.

Subsequently, a second conductive film 505 is formed after the resist mask 504 is removed and then the first conductive film 501 and the second conductive film 505 are electrically connected. (FIG. 1C)

The above is a manufacturing process of the present invention. A number of experiments has been tested on the process illustrated in FIG. 1B.

In order to obtain the state illustrated in FIG. 1A, a Ti film as the first conductive film 501 to be a connection layer is formed by sputtering and a 330 nm of silicon oxide nitride film (represented as $SiO_xN_y$) is formed by using $SiH_4/NH_3/N_2O/Ar$ or $SiH_4/NH_3/N_2/N_2O/Ar$ as the inorganic insulating film 502 on the substrate 500. Next, a 1 $\mu$m of acrylic resin film as the organic resin film 503 is formed in lamination by coating thereon.

The resist mask 504 is then formed by photolithography. In this process, dry etching is performed by employing mixed gas which at least contains oxygen and $CF_4$.

(Experiment 1)

An experiment was conducted by first changing the flow rate ratio of $CF_4$ to oxygen in dry etching. Setting 400 W (2.56 W/cm$^2$) to an RF electric power, 0.4 Torr to a gas pressure, 35 sccm to an He flow rate, and 40 sccm/60 sccm, 45 sccm/55 sccm, 50 sccm/50 sccm, 55 sccm/45 sccm, and 60 sccm/40 sccm to a $CF_4$ flow rate/oxygen flow rate, respectively, the experiment was conducted.

Figure 2A:
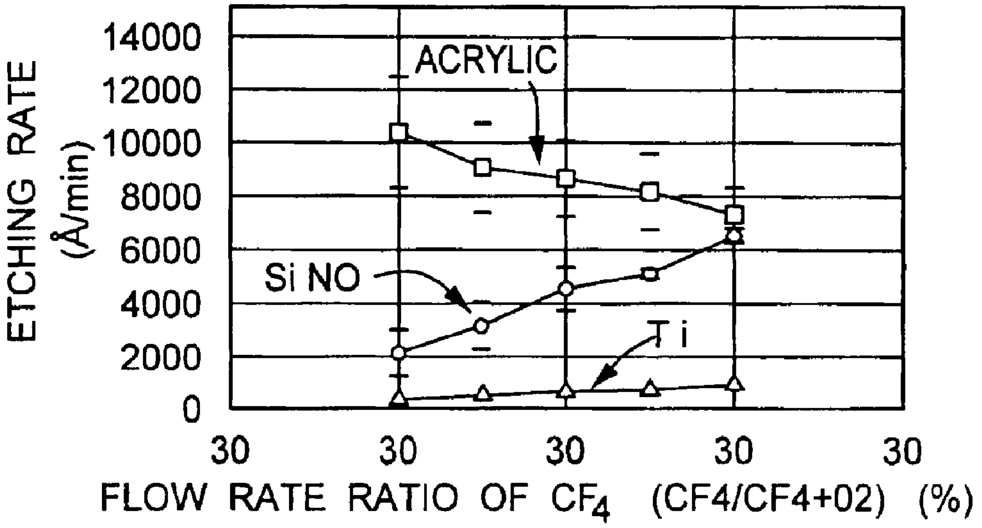
FIGS 2A–2B are graphs illustrating a $CF_4$ flow rate ratio dependency of an etching rate and a selective ratio.
Figure 2B:
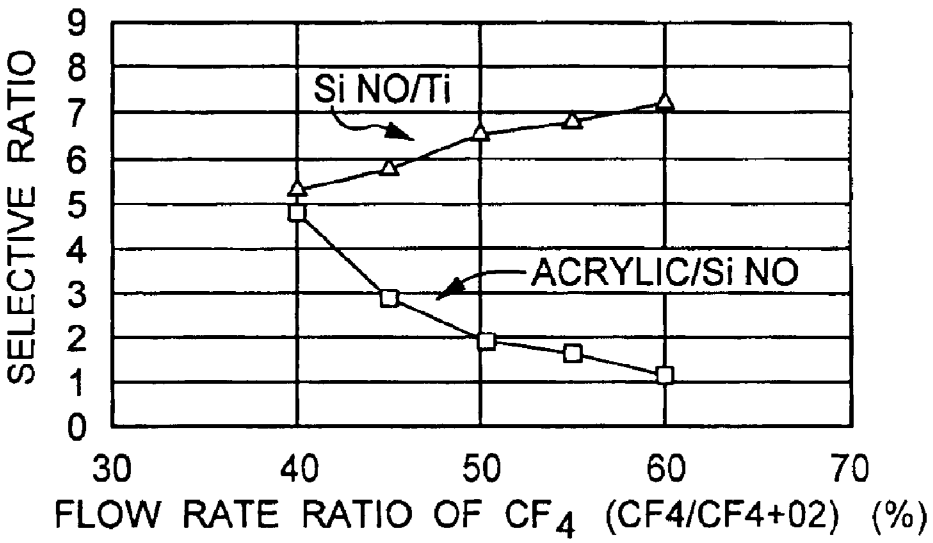

The result of this experiment is shown in FIGS. 2A and 2B. When the flow rate ratio of $CF_4$ is increased, the etching rate of acrylic resin film with respect to the etching gas decreases whereas the etching rate of silicon oxide nitride film with respect to etching gas increases as shown in FIG. 2A. The graph of FIG. 2B illustrating a selective ratio (etching rate of acrylic resin film/etching rate of silicon oxide nitride film, etching rate of silicon oxide nitride film/etching rate of Ti film) is based on FIG. 2A.

Furthermore, photographic views that correspond to the respective flow rate conditions are illustrated in FIGS. 3 and 4.

Among the photographic views of FIGS. 3 and 4, a contact hole that is at its best shape is when the flow rate condition of $CF_4$ is 45 sccm to 55 sccm, preferably 50 sccm (FIG. 3C). An edge portion of the inorganic insulating film that is in contact with the bottom surface of the contact hole in this state is taper like having an angle of 70° from the horizontal surface. And also from FIG. 2B, when the contact hole is most excellently-shaped, the selection ratio is 1.6 to 2.9, preferably 1.9.

An experiment using an organic resin film made of polyimide rather than acrylic was conducted resulting in similar results. And another experiment using a nitrogenous inorganic insulating film such as a silicon nitride film and the like rather than silicon oxide nitride film was conducted and similar results were obtained.

The present inventor has proved from the results of the above experiments that by setting the selective ratio of dry etching (etching rate of organic resin film/etching rate of nitrogenous inorganic insulating film) from 1.6 to 2.9, preferably 1.9, the shape and the size of the contact holes to be formed even in a film of different material and film thickness can be nearly the same in both of the contact holes.

Although the upper portion of the contact hole is slightly an overhanging shape, the coverage of the second conductive film is not influenced as shown in FIG. 3C. The reason for the occurrence of the overhang shape is that a complete anisotropic etching was not performed although by adjusting other etching conditions (gas pressure, RF electric power, etc.), a contact hole of a much better shape can be obtained. The following is a description of experiments conducted by adjusting other etching conditions.

(Experiment 2)

The next experiment was conducted by setting the flow rate ratio of $CF_4$ to oxygen in dry etching at 50/50 and changing the gas pressure. Setting 400 W (2.56 W/cm$^2$) to the RF electric power, 35 sccm to the He flow rate, and 0.2 Torr, 0.3 Torr, 0.4 Torr, and 0.5 Torr to gas pressure, respectively, the experiment was conducted.

Figure 6A:
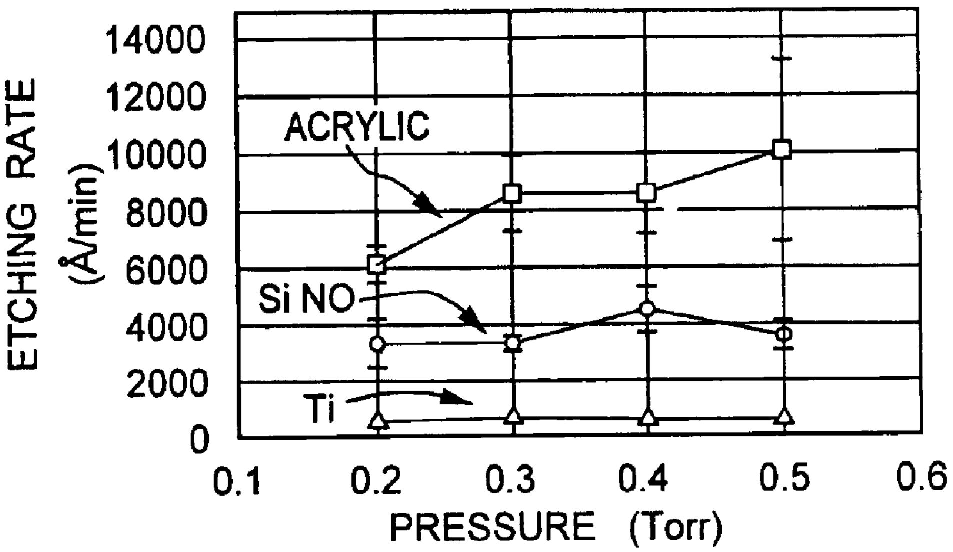
FIGS. 6A–6B are graphs illustrating a gaseous pressure dependency of an etching rate and a selective ratio.
Figure 6B:
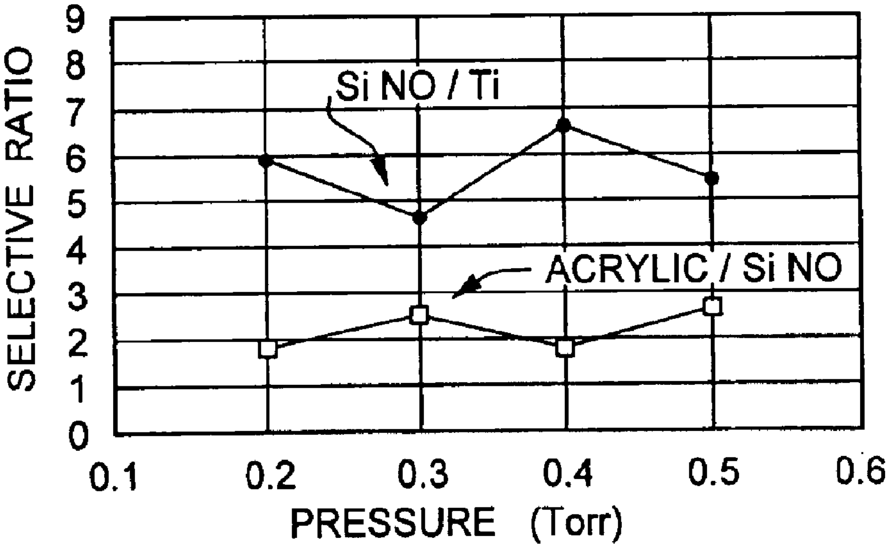

The result of this experiment is shown in FIGS. 6A and 6B. FIG. 6A is a graph illustrating a pressure dependency of the etching rate and FIG. 6B is a graph illustrating a pressure dependency of the selective ratio. By lowering the pressure in this experiment, the overhang in the top portion of the contact hole can be suppressed.

(Experiment 3)

Next, another experiment was conducted by setting the flow rate ratio of $CF_4$ to oxygen in dry etching at 50/50 and changing the RF electric power. Setting 0.4 Torr to gas pressure, 35 sccm to the He flow rate, and 300 W, 400 W, 500 W, and 600 W to the RF electric power, respectively, the experiment was conducted.

Figure 7A:
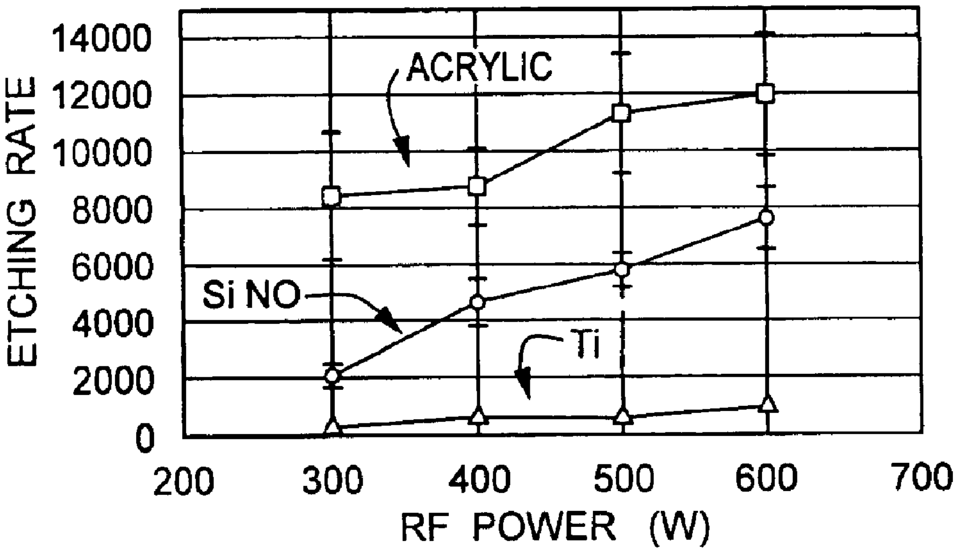
FIGS. 7A–7B are graphs illustrating an RF power dependency of an etching rate and a selective ratio.
Figure 7B:
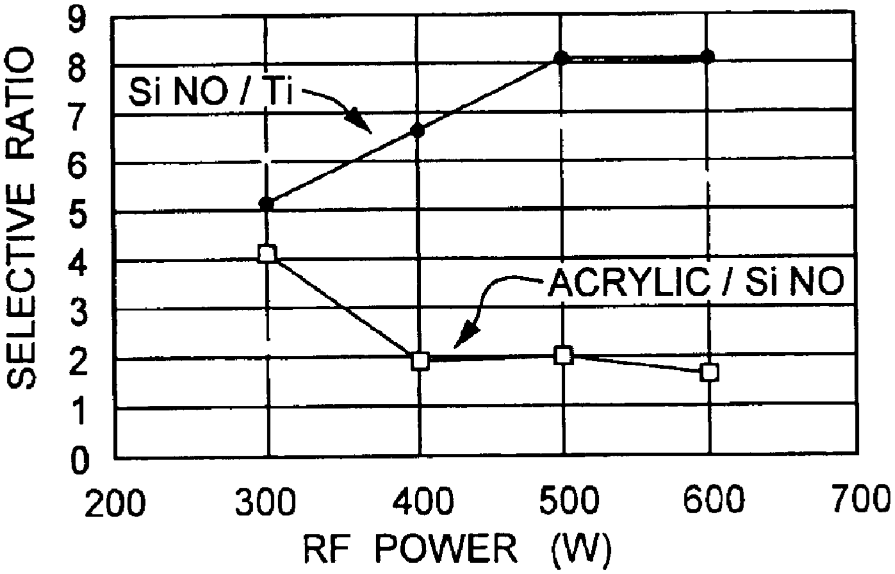

The result of this experiment is shown in FIGS. 7A and 7B. FIG. 7A is a graph illustrating an RF electric power dependency of the etching rate and FIG. 7B is a graph illustrating an RF electric power dependency of the selective ratio. By making the RF electric power higher, the overhang in the top portion of the contact hole can be suppressed.

Figure 5A:
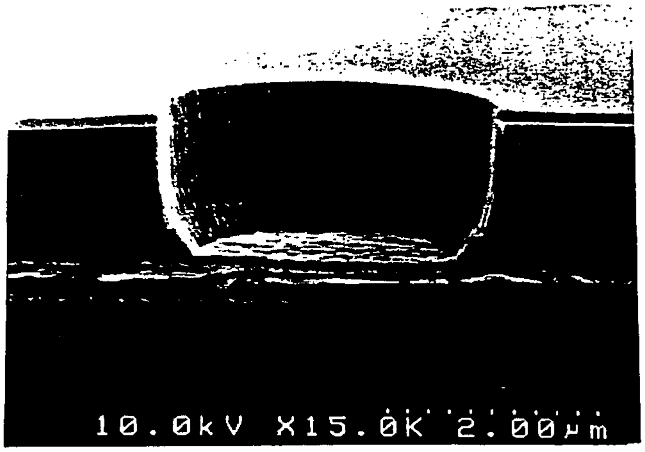
FIGS. 5A–5C are enlarged photographic views and a schematic diagram showing a contact hole.
Figure 5B:
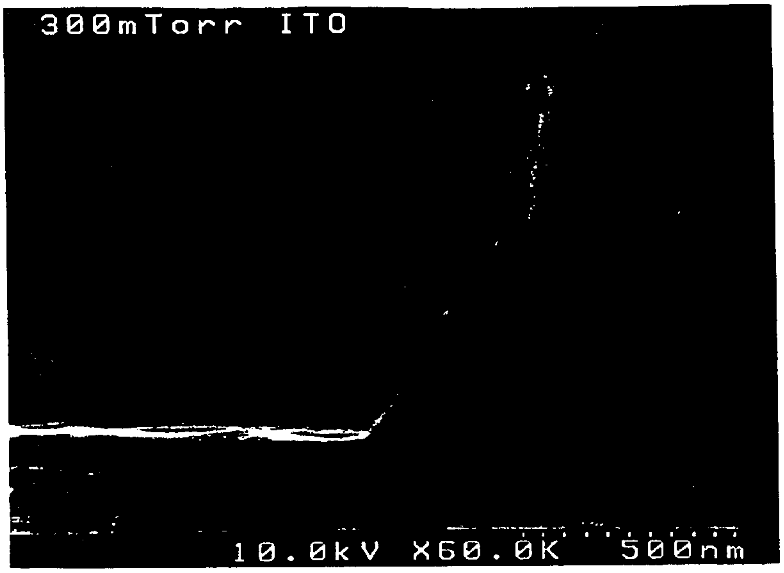
Figure 5C:
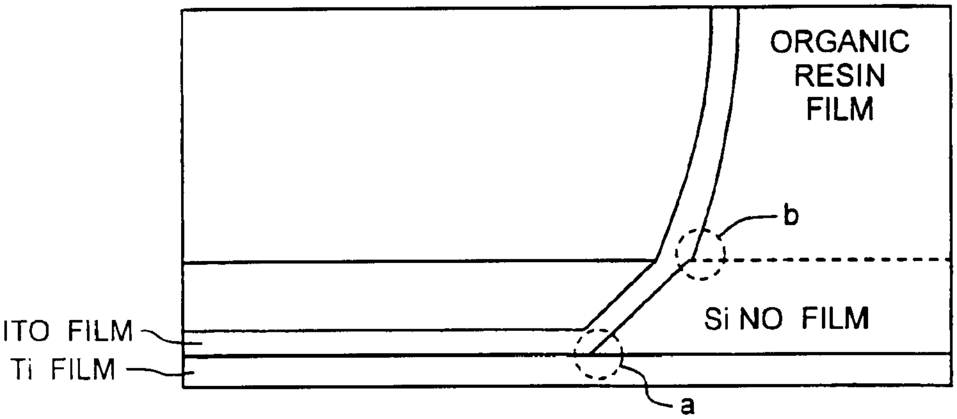

By employing one condition (the flow rate ratio of $CF_4$ to oxygen to He at 50/50/35, gas pressure at 0.3 Torr, RF electric power at 400 W) from among the preferable range that can be obtained from the results of experiments 1 to 3, the contact hole is opened taper shaped in multiple steps and a desirable shape can also be opened without an overhang occurring in the top portion of the contact hole as shown in FIGS. 5A and 5B. FIG. 5C is an enlarged schematic view of the contact hole corresponding to FIG. 5B.

An edge portion of the inorganic insulating film that comes in contact with the bottom surface of the contact hole (FIG. 5C, a) can be taper like with an angle range of 30° to 80° from a horizontal surface by utilizing the present invention. Additionally, an edge portion of the organic resin film that comes in contact with the inorganic insulating film (FIG. 5C, b) can be angled at a range of 50° to 90° from a horizontal surface.

Further, by employing the present invention, a fine shape contact hole with a precise diameter of 3 μm or lower, preferably 1.2 μm or lower, can be achieved.

Furthermore, a more detailed description of embodiments of the present invention is described in the following.

Embodiment 1

An embodiment according to the present invention is described with reference to FIGS. 8 to 11. A manufacturing method that manufactures a pixel circuit and a driving circuit, which controls the pixel circuit, on the same substrate at the same time will be explained here. However, to simplify the explanation, in the driving circuit, a CMOS circuit that is the basic circuit of a shift resist circuit, a buffer circuit, or the like, and an N channel TFT that forms a sampling circuit are shown in the diagrams.

Figures 8A, 8B, 8C, 8D, 8E:
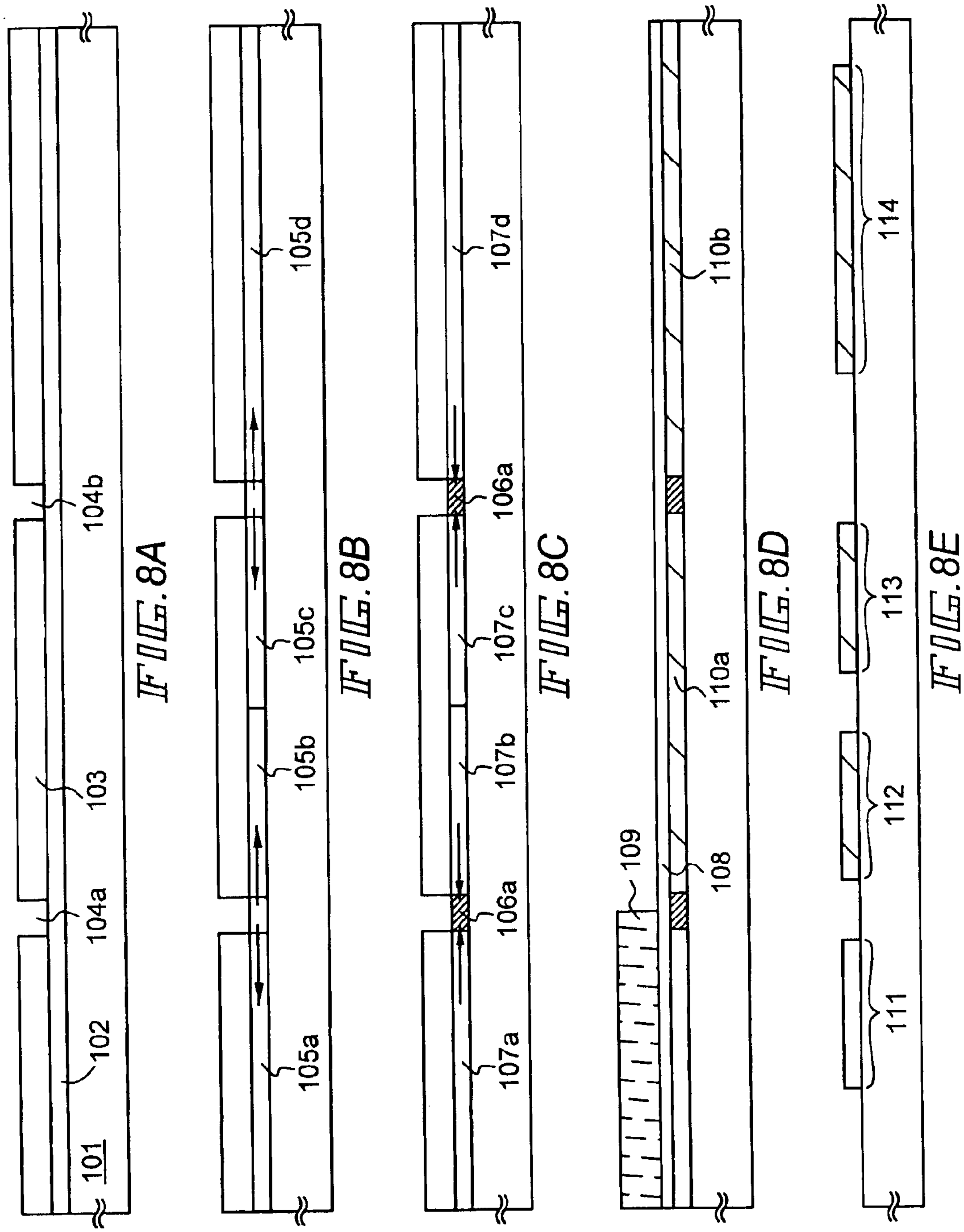
FIGS. 8A–8E are diagrams showing a manufacturing process of a pixel circuit and a driving circuit.

In FIG. 8A, it is preferred that a quarts substrate or a silicon substrate be used as a substrate 101. A quartz substrate is used in the present embodiment. Others such as a metal substrate or a stainless substrate with an insulating film formed thereon can also be used as a substrate. Substrates having heat resistant properties that can stand a temperature of 800° C. are demanded in the present embodiment, therefore any of the substrates that meets this demand can be used.

A semiconductor film 102 with a film thickness of 20 to 100 nm (preferably 40 to 80 nm) containing an amorphous structure is formed by low pressure thermal CVD, plasma CVD, or sputtering on the surface in which a TFT of the substrate 101 is to be formed. Though an amorphous silicon film with a film thickness of 60 nm is formed in the present embodiment, this film thickness is not the final active layer film thickness of the TFT since there is a thermal oxide process later.

Also, as a semiconductor film containing an amorphous structure, there are an amorphous semiconductor film and a microcrystal semiconductor film. A compound semiconductor film containing an amorphous structure such as an amorphous silicon germanium film is included also.

Next, a mask film 103 formed of an insulating film containing silicon is formed on the amorphous silicon film 102, and opening portions 104*a* and 104*b* are formed by patterning. During a crystallization process, the opening portions become a doped region for doping catalytic element to promote crystallization. (FIG. 8A)

Moreover, a silicon oxide film, a silicon nitride film, and a silicon oxide nitride film can be used as the insulating film containing silicon. A silicon oxide nitride film is an insulating film containing a predetermined amount of silicon, nitrogen, and oxygen and an insulating film represented by $SiO_xN_y$. It is possible to manufacture a silicon nitride oxide film using $SiH_4$, $N_2O$, and $NH_3$ as raw gas and better if it contains nitrogen at a concentration of 25 atomic % or higher and less than 50 atomic %.

While performing patterning on the mask film 103, a marker pattern is formed that will be the standard (reference) for a patterning process which will be performed later. When performing etching on the mask film 103, the amorphous silicon film 102 will be slightly etched. However, this step can be used as the marker pattern when joining (aligning) the masks later.

Next, a semiconductor film containing a crystal structure will be formed according to a technology disclosed in Japanese Patent Application Laid-Open No.Hei 10-247735 (corresponding to the serial number of U.S. patent application Ser. No. 09/034,041). The above disclosed technology is a crystallization means using catalytic elements (one or more type of elements chosen from nickel, cobalt, germanium, tin, lead, palladium, iron, and copper) that promote crystallization of the semiconductor film.

To be more specific, heat treatment is performed while holding a catalytic element on a surface of the semiconductor film containing amorphous structure. This is to convert the semiconductor film containing an amorphous structure to a semiconductor film containing a crystal structure. A technology disclosed in an embodiment 1 of Japanese Patent Application Laid-Open No. Hei 7-130652 can be used as a crystallization means. Furthermore, a single crystalline semiconductor film and also a polycrystalline semiconductor film are included as a semiconductor film containing a crystal structure, though a semiconductor film containing a crystal structure formed by using the technology disclosed in the above publication has a crystal grain boundary.

The above publication employs a spin coating method for forming a layer containing a catalytic element on a mask film. However, gaseous methods such as vapor method and sputtering can be as film forming means to form thin films containing a catalytic element.

Depending upon the amount of hydrogen contained in the amorphous silicon film, heat treatment is performed for a duration of 1 hour preferably at 400 to 550° C. It is desired that hydrogen be sufficiently eliminated before crystallization and the preferred amount of hydrogen contained be 5 atomic % or less.

In the crystallization process, first, heat treatment process is performed at 400 to 500° C. for a duration of 1 hour to eliminate hydrogen from the inside of the film, followed by performing heat treatment at 500 to 650° C. (preferably at 550 to 600° C.) for a duration of 6 to 16 hours (preferably for 8 to 14 hours).

In the present embodiment, nickel is used as the catalytic element, and heat treatment is performed for a duration of 14 hours at 570° C. As a result, crystallization progresses in a direction roughly parallel with the substrate (in the direction shown by the arrows) using the opening portions 104*a* and 104*b* as the starting point and semiconductor films (crystalline silicon films in the present embodiment) 105*a*–105*d* having a crystal structure comprising crystals whose crystal growth directions are macroscopically aligned are formed. (FIG. 8B)

Gettering process is performed next to remove the nickel used in the crystallization process from the crystalline silicon film. In the present embodiment, using the mask film 13 that was previously formed just as the mask, the process of adding an element that belongs to group 15 (phosphorous in the present embodiment) is performed and then phosphorous doped regions containing phosphorous (hereinafter referred as gettering region) 106*a* and 106*b* are formed at $1\times10^{19}$ to $1\times10^{20}$ atoms/cm$^3$ of concentration on the crystalline silicon film exposed from the opening portions 104*a* and 104*b*. (FIG. 8C)

Next, heat treatment process is performed at 450 to 650° C. (preferably at 500 to 550° C.) in a nitrogen atmosphere for a duration of 4 to 24 hours (preferably for 6 to 12 hours). Through this heat treatment process, the nickel in the crystalline silicon film moves toward the direction of the arrow and is captured in the gettering regions 106*a* and 106*b* by the gettering action of phosphorus. Namely, since nickel is removed from the crystalline silicon film, the concentration of nickel in crystalline silicon films 107*a* through 107*d* after gettering can be reduced to $1\times10^{17}$ atoms/cm$^3$ or below, preferably up to $1\times10^{16}$ atms/cm$^3$.

Then after removing the mask film 103, a protection film. 108 is formed for doping of impurities later on the crystalline films 107*a* through 107*d*. It is better to utilize either a silicon oxide nitride film or a silicon oxide film with a thickness of 100 to 200 nm (preferably 130 to 170 nm) as the protection film 108. During impurity doping, this protection film 108 is for not exposing the crystalline silicon film directly to the plasma and is meant for making it possible to control subtle concentration.

A resist mask 109 is formed on top of the protection film 108 and an impurity element that gives P-type is doped (hereinafter referred as P-type impurity element) via the protection film 108. A representative element belonging to group 13 as a P-type impurity element, typically boron or gallium can be used. This process (called channel dope process) is to control the threshold voltage of TFT. Furthermore, diborane ($B_2H_6$) is not mass separated but is doped by a plasma excited ion doped method. Of course, ion implantation can be employed to perform mass separation.

In this process, impurity regions 110*a* and 110*b* containing a P-type impurity element (boron in the present embodiment) are formed at a $1\times10^{15}$ to $1\times10^{18}$ atoms/cm$^3$ (typically $5\times10^{16}$ to $5\times10^{17}$ atoms/cm$^3$) concentration. The above concentration range of the impurity region (a region excluding phosphorus) containing P-type impurity element is defined as P-type impurity region (b) in the specifications of the present invention. (FIG. 8D)

Next, the resist mask 109 is removed, patterning is performed on the crystalline silicon film, and island-like semiconductor layers (hereinafter referred as active layer) 111 through 114 are formed. Further, by selectively doping nickel and then performing crystallization, the active layers 111 through 114 are formed of crystalline silicon films of extremely good crystal quality. Specifically, rod like or column like crystal has crystal structures with specific directional properties.

After crystallization, nickel is removed-or reduced by the gettering action of phosphorus, and the concentration of the catalytic element remaining in the active layers 111 through 114 is $1\times10^{17}$ atoms/cm$^3$ or less, preferably $1\times10^{16}$ atoms/cm$^3$. (FIG. 8E)

The active layer 111 of P channel TFT is a region that does not contain an intentionally doped impurity element and the active layers 112 through 114 of N channel TFT are P-type impurity regions (b). The present invention defines the state of all these active layers 111 through 114 as intrinsic or substantially intrinsic. That is, it can be considered that a region intentionally doped with impurities without hindering the operation of the TFT to a certain degree is a substantially intrinsic region.

An insulating film containing silicon with a thickness of 10 to 100 nm is formed by plasma CVD or sputtering. A silicon oxide nitride film of 30 nm thickness is formed in the present embodiment. A single layer or a laminated layer of other insulating films containing silicon can be used as the insulating film containing silicon.

Figure 9A:
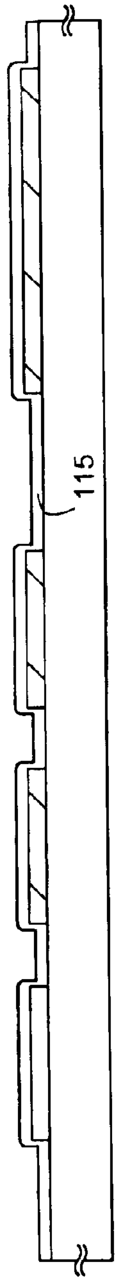
FIGS. 9A–9E are diagrams showing a manufacturing process of a pixel circuit and a driving circuit.

Next, heat treatment process is performed under an oxidizing atmosphere (thermal oxidation process) at a temperature of 800 to 1150° C. (preferably 900to 1000° C.) for a duration of 15 minutes to 8 hours (preferably 30 minutes to 2 hours). In the present embodiment, heat treatment process is performed at 950° C. for 80 minutes under oxygen atmosphere doped with 3% by volume of hydrogen chloride. Furthermore, the boron doped in the process of FIG. 8D is activated during this thermal oxide process. (FIG. 9A)

Oxide reaction is progressing even on an interface between the insulating film containing silicon and the active layers 111 through 114 under this insulating film during the thermal oxidation process. The present invention takes this into consideration and makes adjustments so that the film thickness of a gate insulating film 115 when finally formed is 50 to 200 nm (preferably 100 to 150 nm). In the thermal oxidation process of the present embodiment, oxidation is conducted on 25 nm of the 60 nm thickness of active layers so that the film thickness of the active layers 111 through 114 becomes 35 nm. Since a thermal oxide film with a 50 nm of film thickness is added to a 30 nm thickness insulating film containing silicon, the final film thickness of the gate insulating film 115 will be 105 nm.

Figure 9B:
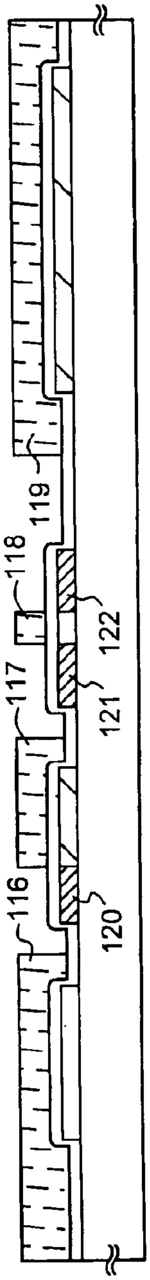
Figure 9C:
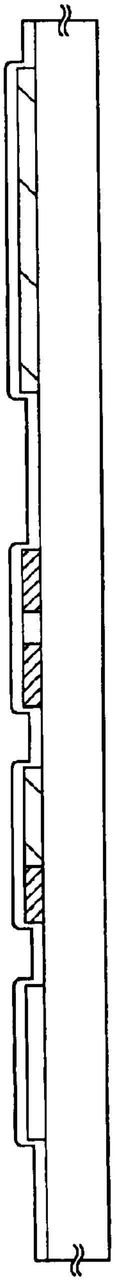

Subsequently, new resist masks 116 through 119 are formed and impurity regions 120 through 122 that presents N-type are formed by adding an impurity element that gives N-type (hereinafter referred to as N-type impurity element). Further, as a representative element belonging to group 15 as an N-type impurity element, typically phosphorus or arsenic can be used. (FIG. 9B)

The impurity regions 120 through 122 are impurity regions for functioning as an LDD region later for the N channel TFT of the CMOS circuit and the sampling circuit. The N-type impurity elements in the impurity regions formed here contain $2\times10^{16}$ to $5\times10^{19}$ atoms/$cm^3$ of concentration (typically $5\times10^{17}$ to $5\times10^{18}$ atoms/$cm^3$). The present invention defines the impurity regions containing N-type impurity elements in the above concentration range as N-type impurity region (b).

Here, mass separation is not performed on phosphine ($PH_3$) and phosphorus is doped at $1\times10^{18}$ atoms/$cm^3$ by plasma excited ion dope means. Of course, the ion implantation method, which performs mass separation, can be employed. Phosphorus is doped in the crystalline silicon film via the gate film 115 in this process.

Next, heat treatment is performed at 600 to 1000° C. (preferably 700 to 800° C.) in an inactive atmosphere in order to activate the phosphorus that was doped in the process of FIG. 9B. In this embodiment, heat treatment is performed at 800° C. for 1 hour in a nitrogen atmosphere.

The active layer and the interface between the active layer and the gate insulating film that was damaged during the doping of phosphorus can be restored. It is preferred that electric heat furnaces be employed in this activating process such as furnace annealing, though light annealing such as lamp annealing and laser annealing can both be used.

Through this process, the connecting portion with the boundary surface of the N-type impurity regions (b) 120 through 122, that is, the intrinsic or substantially intrinsic portion that exists around the N-type impurity region (b) (of course including the P-type impurity region (b)) becomes clear. This means that the LDD region and the channel-forming region will form a remarkably good connecting portion at the time the TFT is completed.

Figure 9D:
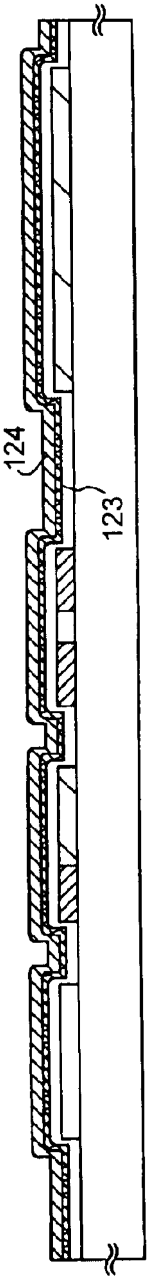
Figure 9E:
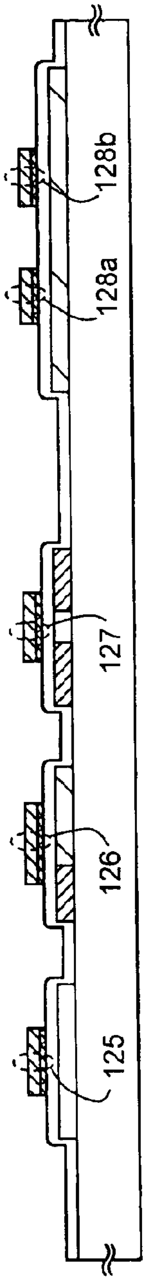

A conductive film that is to be a gate wiring is formed next. Although the gate wiring can be formed as a single layer conductive film, it is preferred that a lamination film of 2 or 3 layers be formed to meet the needs when required. In this embodiment, a first conductive film 123 and a second conductive film 124 are formed as the layered films. (FIG. 9D)

Elements chosen from tantalum (Ta), titanium (Ti), molybdenum (Mo), tungsten (W), chromium (Cr), and silicon (Si); conductive films from the above elements as the main component (typically a, nitride tantalum film, a nitride tungsten film, a nitride titanium film) or alloy films from the combination of the above elements (typically an alloy of Mo—W, an alloy of Mo—Ta) can be used for the first conductive film 123 and the second conductive film 124.

It is better that the first conductive film 123 have a thickness of 10 to 50 nm (preferably 20 to 30 nm) and the second conductive film have a thickness of 200 to 400 nm (preferably 250 to 350 nm). In this embodiment, a 50 nm thickness of nitride tungsten (WN) film as the first conductive film 123 and a 350 nm thickness of tungsten film as the second conductive film 124 are employed. Further, although not shown, it is effective to form a silicon film of about 2 to 20 nm thickness under the first conductive film 123. By forming this silicon film, the adhesion property of the conductive film formed thereon can be improved and oxidation can be prevented.

Employing a nitride tantalum film as the first conductive film 123 and a tantalum film as the second conductive film is also effective.

Next, 400 nm thickness of gate wirings 125 through 128 are formed by etching the first conductive film 123 and the second conductive film 124 together. During this time, the gate wirings 126 and 127, formed in a driving circuit, are formed to overlap with a portion of the N-type impurity regions (b) 120 through 122 through the gate insulating film 115. The gate wirings **128*a* and 128*b* can be seen as two wirings from a cross section, but actually the gate wirings 128*a* and 128*b* are formed of one pattern connected continuously. (FIG. 9**E).

Figures 10A, 10B, 10C, 10D:
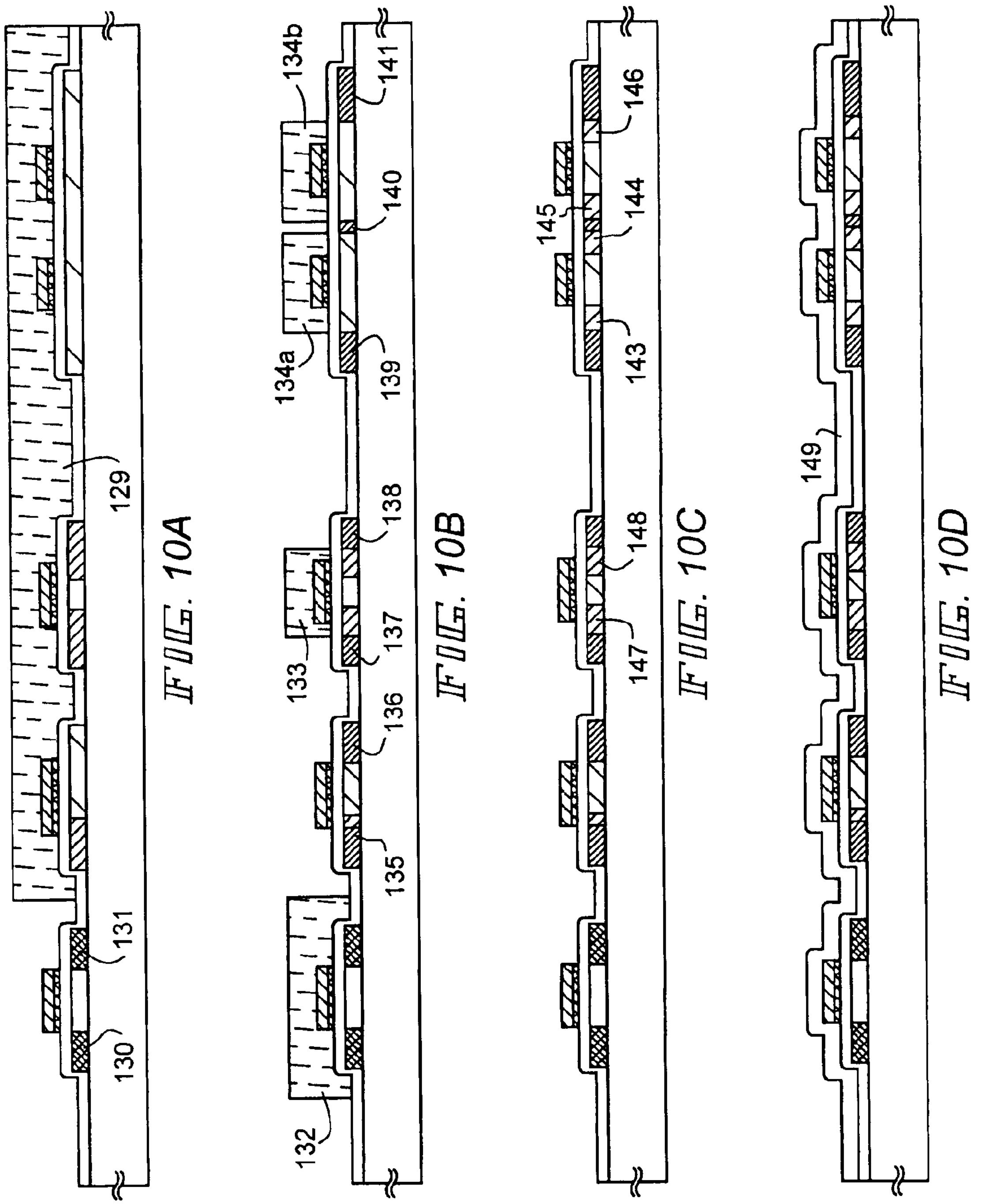
FIGS. 10A–10D are diagrams showing a manufacturing process of a pixel circuit and a driving circuit.
Figure 11A:
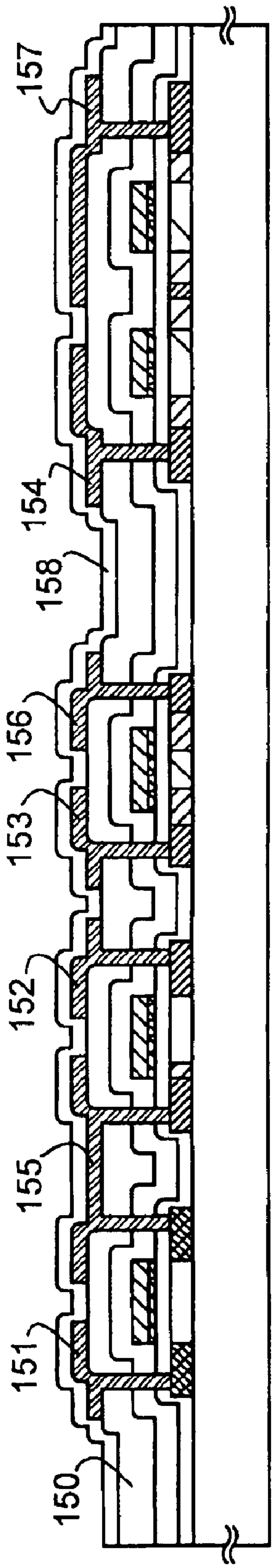
FIGS. 11A–11B are diagrams showing a manufacturing process of a pixel circuit and a driving circuit.
Figure 11B:
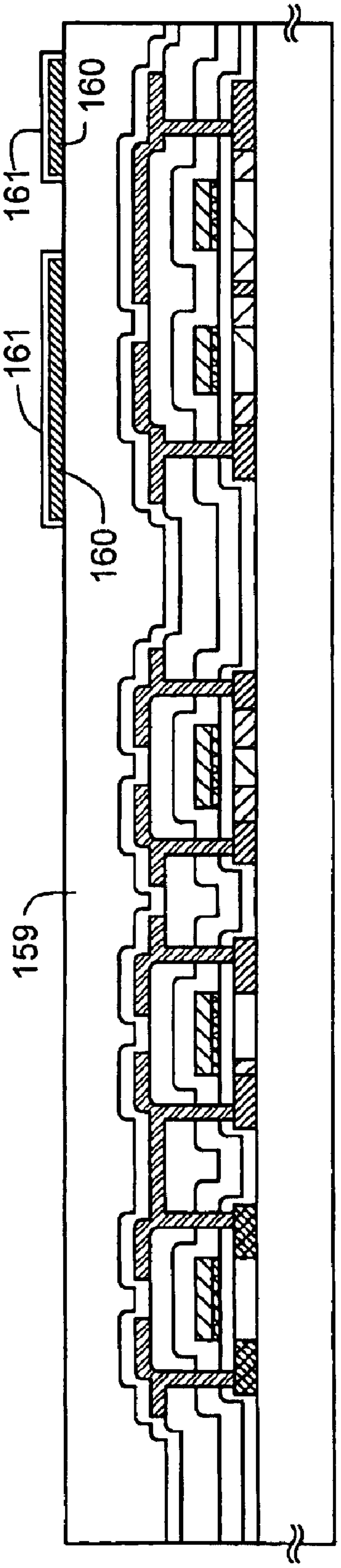

Then a resist mask 129 is formed and a P-type impurity element (boron in this embodiment) is doped so that the impurity regions 130 and 131 containing boron is formed at high concentration. In this embodiment, boron is doped at $3\times10^{20}$ to $3\times10^{21}$ atoms/$cm^3$ (typically $5\times10^{20}$ to $1\times10^{21}$ atoms/$cm^3$) of concentration by the ion doping means employing diborane (of course ion implantation can be used). The present invention defines the impurity regions containing P-type impurity elements in the above concentration range as P-type impurity region (a). (FIG. 10A)

Subsequently, the resist mask 129 is removed and resist masks 132 through 134 are formed so as to cover the gate wirings and a region that is to be a P channel TFT. Then an N-type impurity element (phosphorus in this embodiment) is doped and impurity regions 135 through 141 containing phosphorus are formed at high concentration. The ion doping means employing phosphine ($PH_3$) is also conducted here (of course ion implantation can be used). The concentration of phosphorus in this region is $1\times10^{20}$ to $1\times10^{21}$ atoms/cm$^3$ (typically, $2\times10^{20}$ to $5\times10^{21}$ atoms/cm$^3$). (FIG. 10B)

The specifications of the present invention define the impurity regions containing N-type impurity elements in the above concentration range as N-type impurity region (a). Although the region in which the impurity regions 135 through 141 have been formed already contains phosphorus and boron that were doped in the previous process, there is no need to take into consideration the influences of phosphorus and boron that were doped in the previous process since it is considered that phosphorus was doped at a sufficient high concentration.

Next, the resist masks 132 through 134 are removed and a cap film 142 formed of an insulating film containing silicon is formed at a film thickness of 25 to 100 nm (preferably 30 to 50 nm). A silicon nitride film of 25 nm thickness is used in this embodiment.

Using the gate wirings 125 through 128 as masks, an N-type impurity element (phosphorus in this embodiment) is doped in a self-aligning manner. Impurity regions 143 through 146 formed in this way are adjusted so that phosphorus can be doped at a concentration of ½ to ⅒ of the above N-type impurity regions (b) (typically ⅓ to ¼)(however, a concentration that is 5 to 10 times higher than the concentration of boron doped in the above-mentioned channel doping process, representatively $1\times10^{16}$ to $5\times10^{18}$ atoms/cm$^3$, typically $3\times10^{17}$ to $3\times10^{18}$ atoms/cm$^3$). In the specification, the impurity regions containing N-type impurity elements (however, excluding P-type impurity region (a)) in the above concentration range are defined as N-type impurity region (c). (FIG. 10C)

As phosphorus is doped through a 105 nm film thickness of insulating film (the lamination film of the cap film 142 and the gate insulating film 115), the cap film that is formed on the sidewall of the gate wirings 134*a* and 134*b* also functions as a mask. That is, the length of an off-set region corresponding to the film thickness of the cap film 142 is formed. In order to lower the value of the off-electric current, it is important to suppress the overlap of the LDD region and the gate wiring as much as possible. In this sense, providing an off-set region is effective.

The length of the off-set region is determined by the film thickness of a cap film that is actually formed on the sidewall of a gate wiring or by a wraparound phenomenon during the doping of an impurity element (a phenomenon in which the doping of impurities is like slipping under the mask). From the viewpoint of suppressing the overlap of the LDD region and the gate wiring, it is extremely effective that a cap film be formed in advance when forming the N-type impurity region (c) as in the present embodiment.

As phosphorus is also doped at a concentration of $1\times10^{16}$ to $5\times10^{18}$ atoms/cm$^3$ in all the impurity regions except the portion concealed by the gate wiring in this process, since concentration is extremely low, influences are not inflicted on the functions of each impurity region. Also, as boron is already doped in the N-type impurity regions (b) 143 through 146 at a concentration of $1\times10^{15}$ to $1\times10^{18}$ atoms/cm$^3$ in the channel doping process, phosphorus is doped at a concentration that is 5 to 10 times higher than the concentration of boron in the P-type impurity regions (b). In this situation, it can also be considered that boron does not influence the functions of the N-type impurity regions (b).

However, strictly the phosphorus concentration of a portion of the N-type impurity regions (b) of either 147 or 148 that overlaps with the gate wiring is as it is, $2\times10^{16}$ to $5\times10^{19}$ atoms/cm$^3$, though a $1\times10^{16}$ to $5\times10^{18}$ atoms/cm$^3$ concentration of phosphorus is added to the portion that does not overlap on the gate wiring, which means that the N-type impurity region contains phosphorus at a little higher concentration.

Next, a first interlayer insulating film 149 is formed. The first interlayer insulating film 149 with a film thickness of 100 to 400 m can be formed of an insulating film containing silicon, specifically, a silicon nitride film, a silicon oxide film, a silicon oxide nitride film or a lamination film formed of a combination of the above films.

Then heat treatment process is performed on the N-type or P-type impurity element, doped at its concentration respectively, for activation. In this process, heat treatment can be performed by furnace annealing, laser annealing, lamp annealing, or a combination of methods. If performing by furnace annealing, heat treatment is performed at 500 to 800° C., preferably at 550 to 600° C., in an inactive atmosphere. The impurity elements are activated at 600° C. for a duration of 4 hours in this embodiment. (FIG. 10D)

Moreover, in the present embodiment, the silicon nitride film and the silicon oxide nitride film are formed in a laminated state so as to cover the gate wiring, and activation is performed in this state. Although tungsten is used as the material for wirings in this embodiment, it is known that the tungsten film is extremely weak to oxide. That is, even if the tungsten film is covered with a protective film when oxidized, the tungsten film is oxidized immediately if a pinhole exists in the protective film. Since the silicon nitride film and the silicon oxide nitride film are laminated in this embodiment, activation process can be performed at high temperature without worrying about the pinhole problem.

Heat treatment is performed at 300 to 450° C. for a duration of 1 to 4 hours in an atmosphere containing 3 to 100% of hydrogen after the activation process. Then hydrogenation is carried out on the active layer. This process is to terminate dangling bonds in a semiconductor layer by thermally excited hydrogen. As other hydrogenation means, plasma hydrogenation (using hydrogen excited by plasma) can be performed.

A second interlayer insulating film 150 at a thickness of 500 nm to 1.5 μm is formed on top of the first interlayer insulating film 146 after finishing the activation process. This second interlayer insulating film 150 is a silicon oxide film with an 800 nm thickness formed by plasma CVD in this embodiment. A 1 μm thickness of inter layer insulating film is formed by a lamination film of the first interlayer insulating film 149 (silicon nitride oxide film) and the second interlayer insulating film 150 (silicon oxide film) in this way.

Furthermore, in a later process if thermal resistance permits, organic resin film such as polyimide, acrylic, polyamide, polyimide-amide, BCB (benzocyclobutene), and the like can be used as the second interlayer insulating film 150.

A contact hole that reaches a source region or a drain region of a TFT opens and then source wirings 151 through 154 and drain wirings 155 through 157 are formed. The drain wiring 155 for forming the CMOS circuit is mutualized (common) between the P channel TFT and the N channel TFT. Though not shown, this wiring according to the present embodiment is a 3-layered structure formed of a 200 nm Ti film, a 500 nm aluminum film containing Ti, and a 100 nm Ti film by sputtering in successions.

Subsequently, a silicon nitride film, a silicon oxide film, or a silicon oxide nitride film can be used to form a passivation film 158 at 50 to 500 nm in thickness (typically 200 to 300 nm). According to the embodiment, a silicon nitride oxide film with a film thickness of 300 nm is formed as the passivation film 158. (FIG. 11A) During this time, according to the present embodiment, a plasma process employing gas containing hydrogen such as $H_2$, $NH_3$, and the like is performed in advance before forming the film and then heat treatment is performed after the forming of the film. The excited hydrogen from the previous process is supplied into the first and the second interlayer insulating film. By performing heat treatment in this state, improvements can be made on the film of the passivation film 115 together with effectively hydrogenating the active layer since the hydrogen that was doped into the first and the second interlayer insulating films has diffused to the lower layer.

Furthermore, the hydrogenation process can be performed after forming the passivation film 158. For example, performing heat treatment at 300 to 450° C. for 1 to 12 hours in an atmosphere containing 3 to 100% of hydrogen, or employing a plasma hydrogenation process in which similar effects can be obtained.

Then, a third interlayer insulating film 159 formed of organic resin is formed at about 1 μm in thickness. Polyimide, acrylic, polyamide, polyimide-amide, BCB (benzocyclobutene), etc. can be used as inorganic resin. The advantages of using organic resin are the simplification of forming a film, the reduction of a parasitic capacity due to a low dielectric constant, and having excellent flatness. Other organic resin or organic-based SiO compounds besides the ones mentioned above can be employed as well. Here, after coating the substrate, the interlayer insulating film 159 is formed by baking at 300° C. using a type of acrylic that is thermal polymeric.

In a region that is to be a pixel circuit, a shielding film 160 is formed on top of the third interlayer insulating film 159. In the context of the present invention, the term "shielding film" means the shielding of light and electromagnetic wave. The shielding film 160 is formed of an element selected from aluminum (Al), titanium (Ti), and tantalum (Ta) or has one of these elements as a main component at a thickness of 100 to 300 nm. According to the present embodiment, an aluminum film containing 1 wt % of titanium is formed at 125 nm in thickness.

Moreover, by forming a 5 to 50 nm of insulating film such as a silicon oxide film and the like on top of the third interlayer insulating film 159, the adhesion of the shielding film to be formed thereon can be raised. Further, by applying the plasma process using $CF_4$ gas on to a surface of the third interlayer insulating film 159 formed of inorganic resin, the adhesion of the shielding film to be formed on the film can be raised due to modification of the surface.

By employing the aluminum film containing titanium, not only can the shielding film be formed but other connection wiring can be formed also. For example, connection wiring for connecting circuits in a driving circuit can be formed. However, in this situation, it is necessary to open a contact hole in the third interlayer insulating film in advance before the deposition of the materials that form the shielding film or the connection wire.

Next, an oxide 161 is formed at 20 to 100 nm (preferably 30 to 50 nm) in thickness by anodic oxidation or plasma oxidation on the surface of the shielding film 160 (anodic oxidation in the present embodiment). According to the present embodiment, since a film mainly composed of aluminum is used as the shielding film 160, an aluminum oxide film (alumina film) is formed as the anodic oxide film.

(FIG. 11B) The anodic oxide 161 is formed on the surface of the shielding film 160 at about a thickness of 50 nm thereby the film thickness of the shielding film 160 becomes 90 nm. A user can appropriately set the numeric value that relates to the anodic oxidation method.

The process here was to employ anodic oxidation to form an insulating film provided only on the surface of the shielding film, though other gaseous methods such as plasma CVD, thermal CVD, or sputtering can be employed to form the insulating film. In that case preferably the film thickness be 20 to 100 nm (preferably 30 to 50 nm). Also, a silicon oxide film, a silicon nitride film, a silicon oxide nitride film, a DLC (Diamond like carbon) film, a tantalum oxide film or an organic resin film and further a combination of the above as a lamination film can be used as the insulating film.

Thereafter, a contact hole that goes through the third interlayer insulating film 159 and the passivation film 158 and reaches the drain wiring 157 is opened.

In the present embodiment, after forming a resist mask (not shown), by performing dry etching which uses mixed gas containing $CF_4$ and oxygen ($O_2$), a contact hole that goes through the third interlayer insulating film (acrylic) 159 and the passivation film (silicon oxide nitride film) 158 is opened at the same time in one etching.

Furthermore, according to the present embodiment, the flow rate of $CF_4$ and the flow rate of $O_2$ was adjusted so that the ratio (selective ratio) of the etching rate of the third interlayer insulating film to the etching rate of the passivation film is 2:1. By doing this, a contact hole having a good shape can be opened as shown in FIGS. 5A and 5B.

Dry etching was performed when the flow rate of $CF_4$ was set at 50 sccm, the flow rate of $O_2$ at 50 sccm, the flow rate of He at 35 sccm, electric power of RF at 400 W, and gas pressure at 0.3 Torr.

Figure 12A:
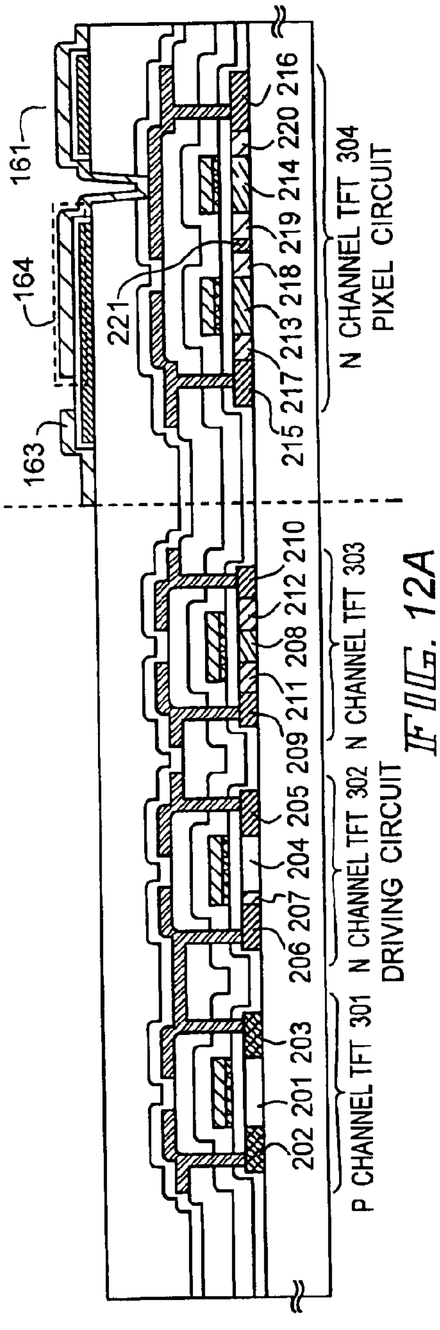
FIGS. 12A–12B are diagrams showing a manufacturing process of a pixel circuit and a driving circuit and a cross-sectional formation view showing an active matrix type liquid crystal display device.

Subsequently, a pixel electrode 162 is formed in the contact hole formed by the above process. A pixel electrode 163 is the pixel electrode of a neighboring different pixel. If the pixel electrodes 162 and 163 are to be transmission type liquid crystal display devices, a transparent conductive film is used. On the other hand, if they are to be reflection type liquid crystal display devices, a metallic film is used. Here the pixel electrodes are transmission type liquid crystal devices; therefore an indium tin oxide (ITO) film is formed to a thickness of 110 nm by sputtering. (FIG. 12A)

The pixel electrode 162 and the shielding film 160 overlap via the anodic oxide 161 to form a capacitance storage 164 at this time. In this case, it is desirable that the shielding film 160 be set at a floating state (in an electrically independent state) or at a fixed electric potential, preferably a common electric potential (inter-electric potential of image signals sent as data).

An active matrix substrate having a driving circuit and a pixel circuit on the same substrate is completed this way. As shown in FIG. 12A, a P channel TFT 301 and N channel TFTs 302 and 303 are formed in the driving circuit; a pixel TFT 304 formed of an N channel TFT is formed in the pixel circuit.

In the P channel TFT 301 of the driving circuit, a channel forming region 201, a source region 202, and a drain region 203 are respectively formed in the P-type impurity regions (a). However, strictly the source region 202 and the drain region 203 contain phosphorus at a concentration of $1\times10^{16}$ to $5\times10^{18}$ atoms/$cm^3$.

Further, in the N channel TFT 302, a channel forming region 204, a source region 205 and a drain region 206 are formed. Also, a region 207, which overlaps a gate wiring via a gate insulating film, is formed between the channel forming region and the drain region (the present invention calls this region "Lov" region, where "ov" refers to overlap). The Lov region 207 at this time contains phosphorus at a concentration of $2\times10^{16}$ to $5\times10^{19}$ atoms/$cm^3$ and is formed as to overlap the gate wiring completely.

Furthermore, in the N channel TFT 303, a channel forming region 208, a source region 209 and a drain region 210 are formed. Also, LDD regions 211 and 212 are formed in manner sandwiching the channel forming region. That is, an LDD region is formed between the source region and the channel forming region, and between the drain region and the channel forming region.

Since the LDD regions 211 and 212 are arranged so that a portion of the region overlaps with the gate wiring in this structure, via a gate insulating film, a region that overlaps with the gate wiring (Lov region) and a region that does not overlap with the gate wiring (the present invention calls this type of region "Loff region,", "off" meaning offset) are realized.

The LDD region 211 can further be classified as an Lov region and an Loff region. The above Lov region contains phosphorus at a concentration of $2\times10^{16}$ to $5\times10^{19}$ atoms/$cm^3$ while the Loff region contains phosphorus at a concentration that is 1 to 2 times higher that the Lov region (typically, 1.2 to 1.5 times).

In the pixel TFT 304, channel forming regions 213 and 214, a source region 215, a drain region 216, Loff regions 217 through 220, and an N-type impurity region (a) 221 that contacts with the Loff region 218 and 219 are formed. At this time, the source region 215 and the drain region 216 are respectively formed in the N-type impurity region (a) and the Loff regions 217 through 220 are formed in the N-type impurity region (c).

The present embodiment is able to improve the operating efficiency and reliability of a semiconductor device by optimizing the structure of TFTs which form each circuit to meet the circuit specifications demanded by pixel circuits and driving circuits. More specifically, N channel TFT can realize both a TFT structure attaining a high-speed operation or focusing on a hot carrier countermeasure and a TFT structure focusing on a low off current operation on the same substrate by making the arrangement of the LDD region different depending upon the circuit specifications and by distinguishing the Lov region from the Loff region.

Moreover, the width of the Lov region 207 of the N channel TFT 302 is 0.3 to 3.0 $\mu$m, typically. 0.5 to 1.5 $\mu$m, with respect to the 3 to 7 $\mu$m of channel length. The width of the Lov region and the Loff region of the N channel TFT can be 0.3 to 3.0 $\mu$m, typically 0.5 to 1.5 $\mu$m, and 1.0 to 3.5 $\mu$m, typically 1.5 to 2.0 $\mu$m respectively. The width of the Loff regions 217 to 220 provided in the pixel TFT 304 can be 0.5 to 3.5 $\mu$m, typically 2.0 to 2.5 $\mu$m.

The present embodiment uses an alumina film that has a high 7 to 9 dielectric constant as the dielectric of capacitance storage, and therefore the occupying area that is necessary for the capacitance storage to form the necessary capacity can be reduced. Moreover, the opening rate (aperture ratio) of the image display portion of the active matrix liquid display device can be improved by making the shielding film, which is formed on the pixel TFT, as the other electrode of the capacitance storage as in the present embodiment.

The present invention is not necessarily limited to the structure of the capacitance storage indicated in the present embodiment. For example, a structure of a capacitance storage disclosed by the present applicant in Japanese Patent Application No. Hei 9-316567, Japanese Patent Application No. Hei 9-273444, or Japanese Patent Application No. Hei 10-254097 can be used.

Figure 12B:
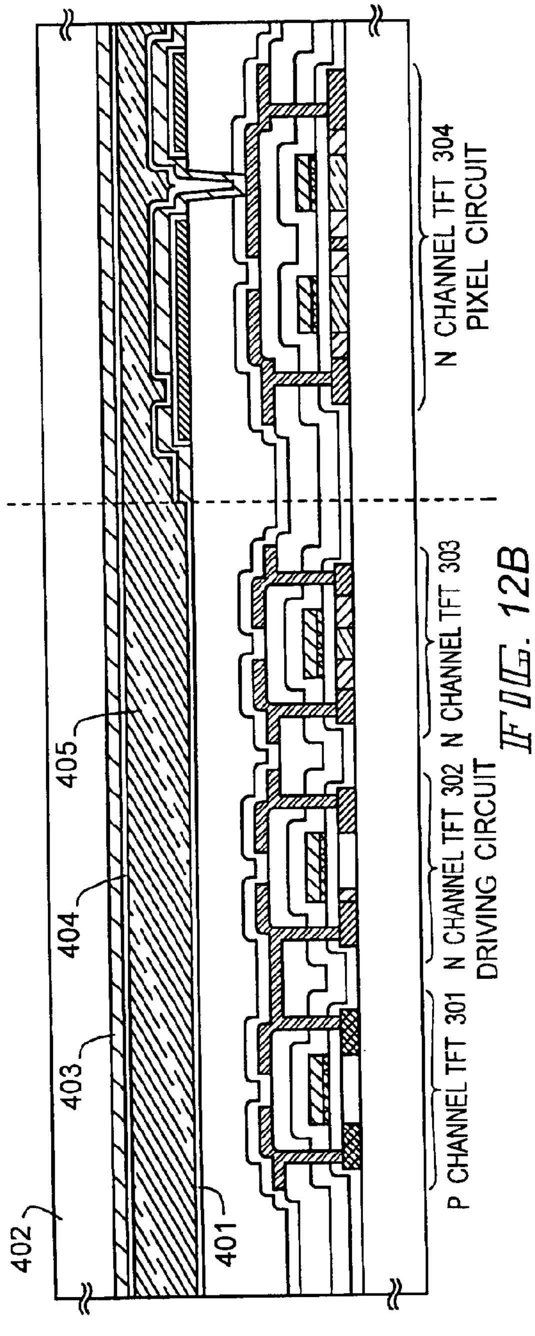

A process of manufacturing an active matrix liquid crystal display from an active matrix substrate is described hereon. As shown in FIG. 12B, an orientated film 401 is formed on a substrate in the state shown in FIG. 12A. A polyimide film is used as the orientated film in the present embodiment. Then a facing electrode (counter electrode) 403, formed of transparent conductivity film, and an orientated film 404 are formed on a facing substrate (counter substrate) 402. It is appropriate to form a color filter or a shielding film on the facing substrate (counter substrate) whenever it requires.

After forming the orientated film, a rubbing operation is performed to make adjustments so that the crystal molecules are orientated at a fixed pre-tilt angle. Then using a well-known cell assembling process, the counter substrate and the active matrix substrate formed of the pixel circuit and the driving circuit are stuck with sealing materials or a spacer (both not shown). Then, after injecting a liquid crystal 405 between the two substrates, the liquid crystal is completely sealed by a sealing agent (not shown). It is appropriate to use well-known liquid crystal material as the liquid crystal. The active matrix liquid crystal display device is completed in this way as shown in FIG. 12B.

The structure of the active matrix liquid crystal display device will be described next with reference to the perspective view of FIG. 13. It should be noted that the same reference numerals as that of FIGS. 8 through 12 are used in FIG. 13 for correspondence. The active matrix substrate comprises a pixel circuit 801, a scanning (gate) signal driving circuit 802, and an image (source) signal driving circuit 803, which are formed on the quarts substrate 101. The pixel TFT 304 of the pixel circuit is an N channel TFT, and the driving circuit provided in the periphery is structured with a CMOS circuit as the basic circuit. The scanning signal driving circuit 802 and the image signal driving circuit 803 are connected to the pixel circuit 801 by the gate wiring 128 and source wiring 154, respectively. Connecting wiring 806 and 807 are provided from an external input/output terminal 805 connected by a FPC 804 to the input/output terminal of the driving circuit.

Figure 13:
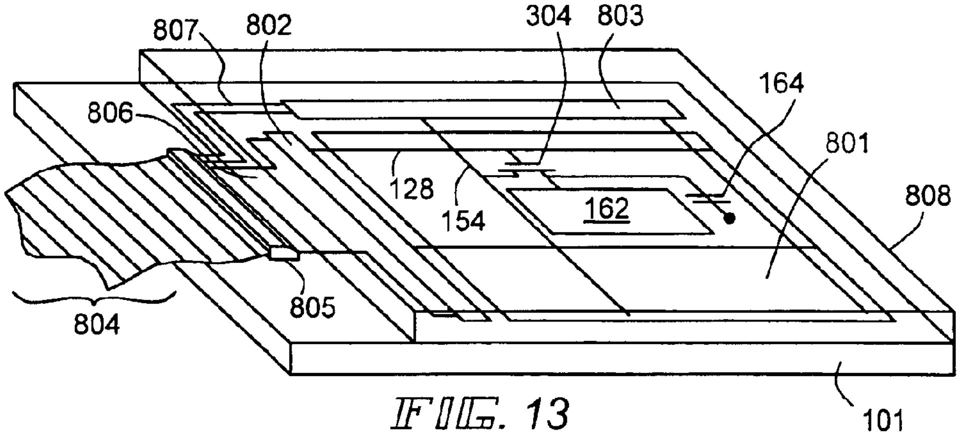
FIG. 13 is a perspective view schematically showing an active matrix type liquid crystal display device.
Figure 14:
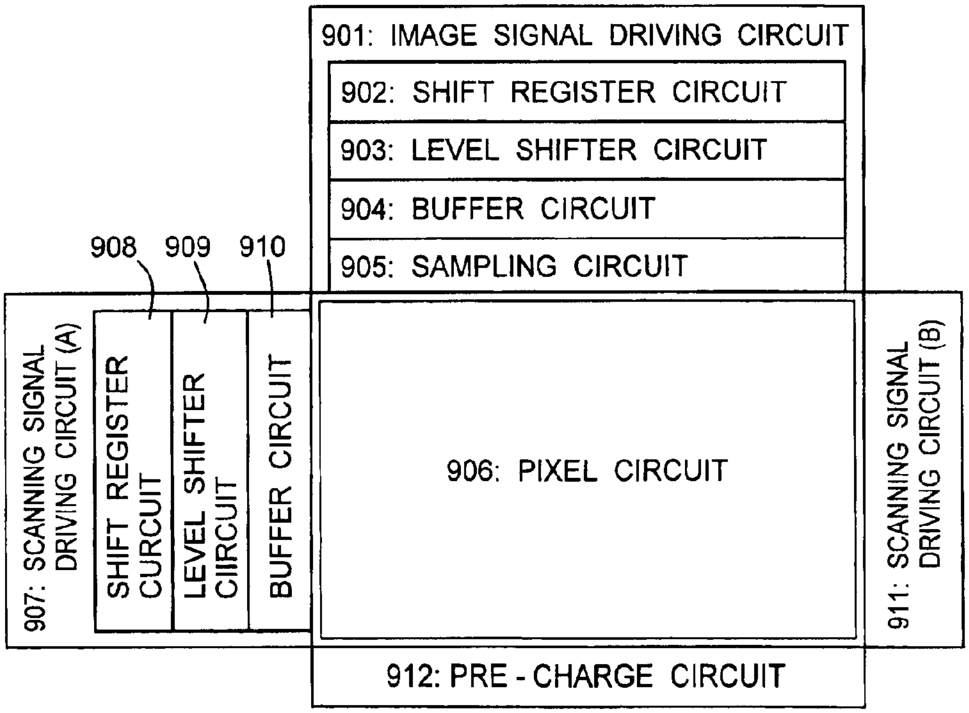
FIG. 14 is a block diagram showing a circuit of an active matrix type liquid crystal display device.

Further, the illustration in FIG. 14 is an example of a structure of a circuit of the active matrix liquid crystal display shown in FIG. 13. The active matrix liquid crystal display device according to the present embodiment has an image signal driving circuit 901, a scanning signal driving circuit (A) 907, a scanning signal driving circuit (B) 911, a pre-charge circuit 912, and a pixel circuit 906. According to the present invention, the image signal driving circuit 901 and the scanning signal driving circuit 907 are included in the driving circuit.

Furthermore, the structure of the present invention can be easily realized by manufacturing a TFT following the processes indicated in FIGS. 8 through 12. Although the present embodiment illustrates only the structure of a pixel circuit and a driving circuit, other signal operating circuits (or logic circuits) such as a signal division circuit, a frequency dividing circuit, a D/A converter circuit, an operational amplifier circuit, a $\gamma$ correction circuit, and a microprocessor circuit as well can be formed on the same substrate according to the manufacturing method of the present invention.

In this way, the present invention can provide a semiconductor device that includes on the same substrate at least a pixel circuit and a driving circuit for controlling the pixel circuit. For example, a semiconductor device provided with a signal operating circuit, a driving circuit, and a pixel circuit all on the same substrate can be realized.

A crystalline silicon film that has unique crystal structures in which the crystal lattices have continuous characteristics is formed if the process according to the present embodiment is performed until FIG. 9B. Details relating to this kind of crystalline silicon film can be referred by the present applicant in Japanese Patent Application No. Hei 10-044659, Japanese Patent Application No. Hei 10-152316, Japanese Patent Application No. Hei 10-152308, or Japanese Patent Application No.Hei 10-152305. Hereinafter, a characteristic of a crystal structure experimentally examined by the applicant is briefly explained. Besides, this characteristic coincides with the characteristic of the semiconductor layer in this embodiment which forms the active layer of the TFT.

The above crystalline silicon film has a crystal structure in which there are a plurality of needle like and rod like crystals (hereinafter abbreviated as rod-like crystal) collectively arranged as seen from a microscopic observation. This can be easily confirmed by observation through a TEM (transmission electron microscope).

Further, by utilizing electron beam diffraction and X-ray diffraction, it can be confirmed that the surface of the crystalline silicon film (the portion that forms a channel) has a {110} plane as the main orientation plane though the crystal axis is somewhat tilted. If an analysis was performed using the electron beam diffraction now, it can be confirmed that the diffraction spot, which corresponds to the {110} plane, will appear nicely. The fact that each spot has a concentric circle distribution can also be confirmed.

Furthermore, when the grain boundary formed by the connection of every rod-like crystal is observed through a HR-TEM (High Resolution-Transmission Electron Microscope), the crystal lattice of the grain boundary having continuity properties can be confirmed. This observation can be easily confirmed from the fact that the lattice stripes in the grain boundary being observed were continuously linked together.

Due to the continuity of the crystal lattices in the crystal grain boundary, the crystal grain boundary is called "plane-like grain boundary". In the present invention, the definition of the plane-like grain boundary is "planar boundary disclosed in "Characterization of High-Efficiency Cast-Si Solar Cell Wafers by MBIC Measurement; Ryuichi Shimokawa and Yutaka Hayashi, Japanese Journal of Applied Physics vol. 27, No. 5, pp. 751–758, 1988

According to the above article, a twin grain boundary, an unique lamination defect, and an unique twist grain boundary are included as the plane-like grain boundary and this plane-like grain boundary has a characteristic of being electrically inactive. That is, although the plane-like grain boundary is a crystal grain boundary, it does not function as a trap to obstruct the movements of carriers. Thus, the plane-like grain boundary can be regarded as substantially non-existing.

Especially when the crystal axis (perpendicular axis to the crystal plane) is axis <110>, a {211} twin crystal grain boundary can also be called the corresponding grain boundary of the Σ3. The value of Σ3 is a parameter, that is a pointer for indicating the degree of conformity of the corresponding grain boundary. The smaller the value of Σ, the better the conformity of the grain boundary is well known.

If the crystalline silicon film of the present embodiment is actually observed in detail under the TEM, almost all (above 90%, typically above 95%) of the crystal grain boundary are the Σ3 of the corresponding grain boundary, typically the {211} twin crystal grain boundary.

It is known that the grain boundary formed between two crystal grains becomes the corresponding grain boundary of Σ3 when the plane direction of the two crystals is {110} and the angle θ formed by a lattice stripe which corresponds to a {111} plane is θ=70.5°. Each lattice stripe of the crystal grains lined next to each other in the crystal grain boundary of the crystalline silicon film according the present embodiment is surely linked together at an angle about 70.5°. From this fact, it can be said that the crystal grain boundary is the corresponding grain boundary of Σ3.

Moreover, the crystal grain boundary becomes the corresponding grain boundary of Σ9 when θ=38.9° meaning that other corresponding grain boundaries do exist. However, in any case, all are inactive.

Corresponding grain boundaries of this type are only formed between crystal grains of the same plane direction. That is, the plane direction of the crystalline silicon film of the present embodiment is substantially aligned at {110} which is why a wide range of this type of corresponding grain boundary can be formed.

This kind of crystal structure (precisely the structure of a crystal grain boundary) indicates that the joining of two different types of crystal grains in the crystal grain boundary is extremely conforming. That is, in the crystal grain boundary, the crystal lattices are linked together continuously and structured in such a way making it extremely difficult to form trap levels which are caused by crystal defects and the like. Hence, it can be regarded that crystal grain boundary substantially does not exist in a semiconductor thin film having this kind of crystal structure.

Furthermore, it has been confirmed from a TEM observation that almost all the defects existing inside a crystal grain are extinguished through a heat treatment process at a very high temperature of 800 to 1150° C. (corresponding to the thermal oxidation in embodiment 1). This is obvious since the number of defects has been largely lessened after thermal oxidation.

The difference in the number of defects will appear as the difference in spin density through an electron spin resonance analysis (ESR). The spin density of the crystalline silicon film according to the present embodiment in the present state has been identified as at least $5\times10^{17}$ spins/cm$^3$ or less (preferably $3\times10^{17}$ spins/cm$^3$ or less). However, this measured value is near the value that the present existing measurement device can limitedly detect. The actual spin density is expected to be lower.

From the above explanation, the defects inside a crystal grain of the crystalline silicon film according to the present embodiment are extremely small, and since it is proved that a crystal grain boundary substantially does not exists, it is appropriate to consider the crystalline silicon film as a single-crystal silicon film or a substantially single-crystal silicon film.

Embodiment 2

The present invention can be employed when an interlayer insulating film is formed on a conventional MOSFET and when forming a TFT thereon. That is, the realization of a three-dimensional structure semiconductor device is possible. Further, SOI substrates such as the SIMOX, the Smart-Cut (registered trademark of SOITEC), the ELTRAN (registered trademark of Canon Inc.), etc. can be used as a substrate.

Moreover, the structure of the present invention can be freely combined with any one of the structures in embodiment 1.

Embodiment 3

Figure 15:
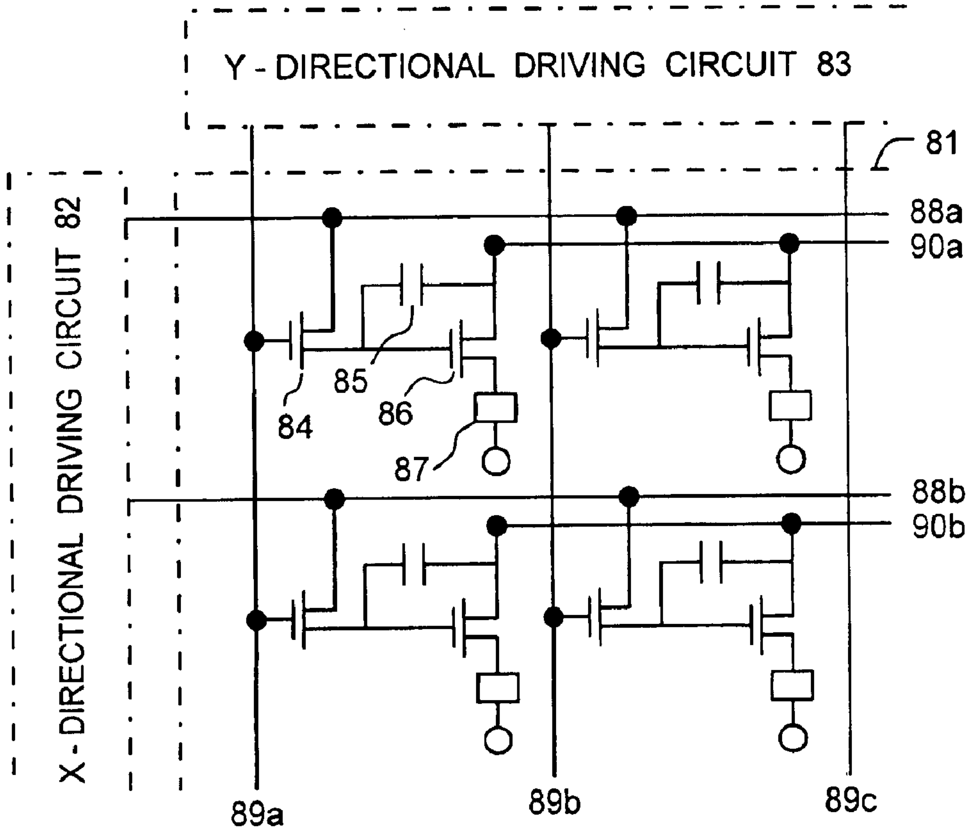
FIG. 15 is a diagram showing a structure of an active matrix type EL display device.

The present invention can be applied to an active matrix EL display of which an example is shown in FIG. 15.

FIG. 15 is a diagram showing a circuit of the active matrix EL display. In the figure, reference numeral 81 denotes a pixel circuit and provided around the circuit are an X-directional driving circuit 82 and a Y-directional driving circuit 83. Each pixel in the pixel circuit 81 has a TFT switch 84, a condenser 85, an electric current control TFT 86, and an organic EL element 87. An X-directional signal line 88*a* (or 88*b*) and a Y-directional signal line 89*a* (or 89*b*) are connected to the TFT switch 84. Power source lines 90*a* and 90*b* are connected to the electric current control TFT 86.

When forming a contact hole in the active matrix EL display according to the present embodiment, etching is performed once to simultaneously form a lamination film by using the technique described in the present embodiment.

Furthermore, the structure in either embodiment 1 or 2 may be combined with respect to the active matrix EL display of the present embodiment.

Embodiment 4

A diversity of crystal liquid materials can be used in a liquid crystal display device manufactured by the present invention. As such materials, there are TN liquid crystal, PDLC (Polymer Distributed Liquid Crystal), FLC (Ferroelectric Liquid Crystal), AFLC (Antiferroelectric Liquid Crystal), or a mixture of FLC and AFLC (Antiferroelectric LCD).

For example, materials disclosed in "H. Furue et al.; Characteristics and Driving Scheme of Polymer-Stabilized Monostable FLCD Exhibiting Fast Response Time and High Contrast Ratio with Gray-Scale Capability, SID, 1988", "T. Yoshida et al.; A Full-Color Thresholdless Antiferroelectric LCD Exhibiting Wide Viewing Angle with Fast Response Time, 841, SID97DIGEST, 1997", "S. Inui et al.; Thresholdless Antiferroelectricity in Liquid Crystals and its Application to Displays, 671–673, J. Mater. Chem. 6(4), 1996", or U.S. Pat. No. 5,594,569 can be used.

Specifically, with respect to an electric field, as Thresholdless Antiferroelectric LCD (abbreviated as TL-AFLC) that indicates electro-optical response characteristic of continuously changing transmission rate, there is a type that indicates a V-shaped type (or U-shaped type) of electro-optical response characteristic. It has been proved that the drive voltage is approximately ±2.5 V (cell thickness is about 1 $\mu$m to 2 $\mu$m). Due to this fact, there are cases where the power voltage for pixel circuits is sufficient from 5 to 8 V and the possibility of operating the driving circuit and the pixel circuit at the same power source voltage has been suggested. That is, attempts can be made on the low consumption of electric power of the whole liquid display device.

Ferroelectric liquid crystals and antiferroelectric liquid crystals have an advantage of having a faster response velocity when compared with TN liquid crystals. For realizing TFTs like the TFT used in the present invention which has extremely rapid operational velocity, a liquid crystal display device having a fast image response velocity can be realized by sufficiently utilizing the speed of the response velocity of ferroelectric liquid crystals and antiferroelectric liquid crystals.

Generally, the voluntary polarization of the thresholdless antiferroelectric LCD is large and the dielectric constant high. For this reason, when utilizing the thresholdless ferroelectric liquid crystal in the liquid crystal display device, a comparatively bigger capacitance storage is needed for the pixel. Therefore, the utilization of a thresholdless antiferroelectric LCD of smaller voluntary polarization is preferred. In this sense, the capacitance storage shown in FIG. 8A of embodiment 1 is preferable since this capacitance storage can accumulate a large capacity in a small area.

Needless to say, utilizing the liquid crystal display device of this embodiment as the display for electronic equipment such as a personal computer and the like is effective.

Moreover, the structure of this invention may be freely combined with a structure of any one of embodiments 1 to 3.

Embodiment 5

On account of improving the uniformity of the shape of a contact hole in this embodiment, an example different from an embodiment mode of carrying out the present invention is shown in FIG. 16.

Figure 16A:
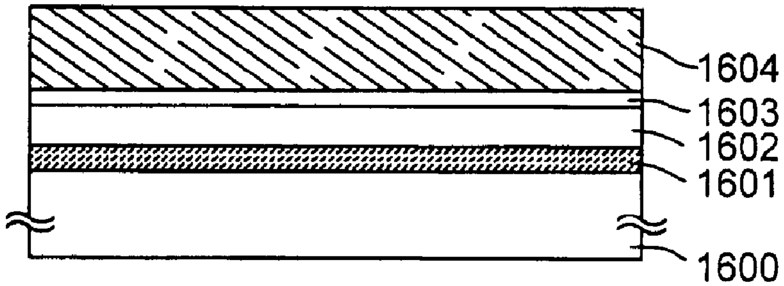
FIGS. 16A–16C are diagrams showing a manufacturing process in accordance with an embodiment 5 of the present invention.
Figure 16B:
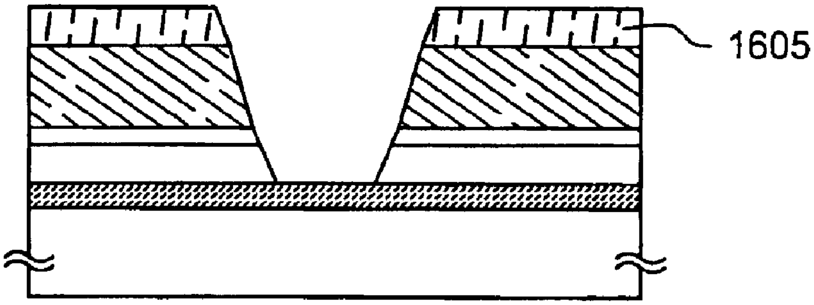

First, a first conductive film 1601, a first insulating film 1602, a thin second insulating film, and an organic resin film 1604 are formed one after another in laminations on a substrate 1600. (FIG. 16A)

A silicon nitride film, a silicon oxide film, or a silicon oxide nitride film all of which at 100 to 400 nm in thickness can be used as the first insulating film. A 200 nm thickness of silicon oxide nitride film formed by plasma CVD using $SiH_4$, $N_2O$, and $NH_3$ as raw gas is used in this embodiment (however, nitrogen concentration is 25 to 50 atomic %).

Further, although a 30 nm thickness of silicon oxide film formed by plasma CVD is used in this embodiment as the second insulating film, other silicon oxide films with a 20 to 50 nm in thickness can be used.

Furthermore, the organic resin film is formed of a 1 $\mu$m of acrylic resin film that is formed in laminations by the coating method.

After achieving the state in FIG. 16A, a resist mask 1605 is formed by photolithography and then the lamination film of the laminated first insulating film 1602 and the organic resin film 1604 are simultaneously etched one time to form a contact hole. (FIG. 16B) This etching is dry etching using etchant gas, which is mixed gas containing at least oxygen and fluorine-based gas. In this embodiment, dry etching was conducted with the flow rate of $CF_4$ set at 50 sccm, flow rate of $O_2$ at 50 sccm, flow rate of He at 35 sccm, electric power of RF at 400 W, and gas pressure at 0.3 Torr.

Figure 16C:
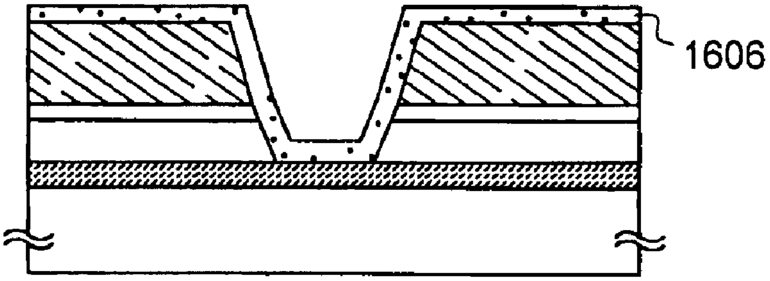
Figure 17A:
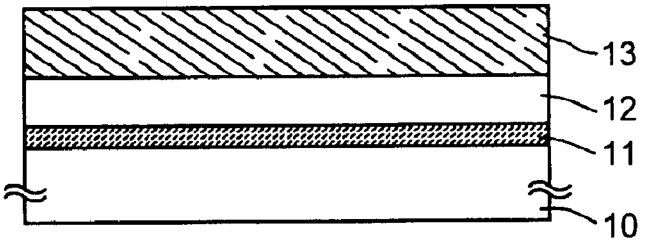
FIGS. 17A–17D are diagrams showing an example of a conventional manufacturing process.
Figure 17B:
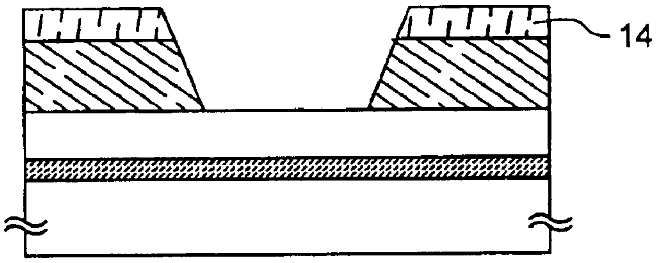
Figure 17C:
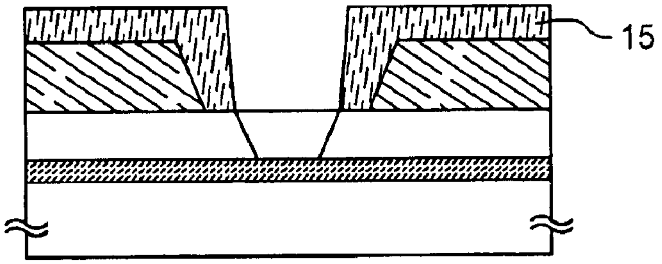
Figure 17D:
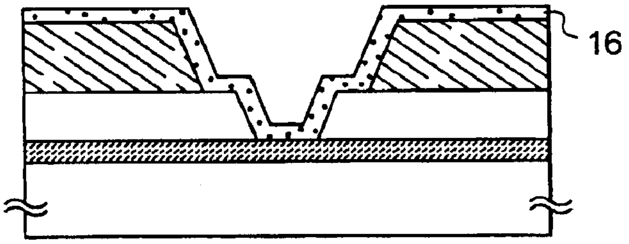

Subsequently, after removing the resist mask 1605, the second conductive film 1606 is formed and electrically connected to the first conductive film 1606. (FIG. 16C)

Compared with the etching rate of the organic resin film 1604 and the first insulating film 1602, the second insulating film 1603 with a slower etching rate has been chosen in this embodiment. Since the film thickness of the second insulating film 1603 is thin, removal is accomplished without changing the conditions. By using this type of second insulating film, there are no longer any etched remains of organic resin and a contact hold with little dispersion in its shape can be formed.

This embodiment can be freely combined with any one of embodiments 1 to 4.

Embodiment 6

Figure 18A:
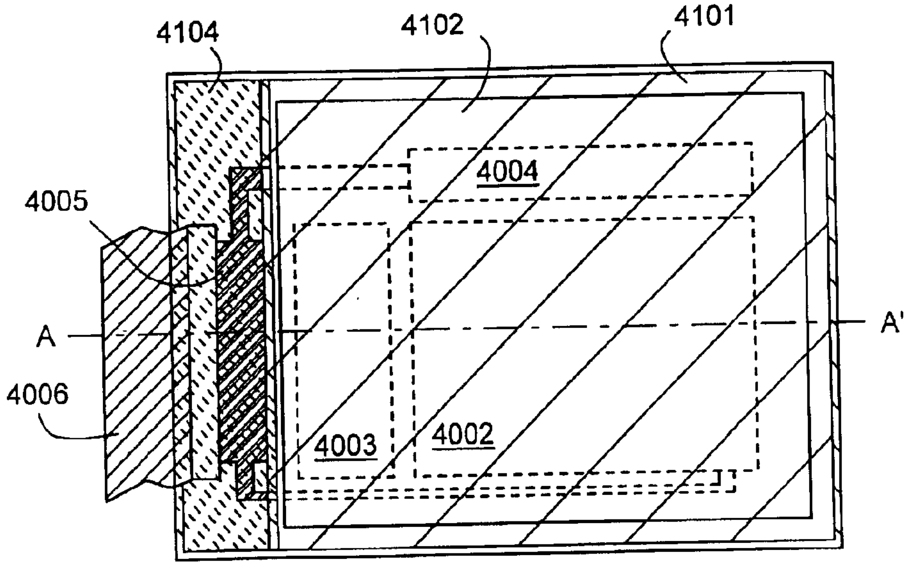
FIGS. 18A–18B are diagrams showing a sectional structure of an active matrix type EL display device.

An example of an EL (electroluminescence) display device manufactured by employing the present invention is described in this embodiment. FIG. 18A is a top sectional view and FIG. 18B is a cross-sectional view of the EL display device of the present invention.

In FIG. 18A, reference numeral 4001 denotes a substrate, 4002 a pixel portion, 4003 a source side driving circuit, and 4004 a gate side driving circuit. The respective driving circuits are connected to an external equipment by a wiring 4005 through an FPC (flexible print circuit) 4006.

A first sealing material 4101, a covering material 4102, a filling material 4103, and a second sealing material 4104 are provided in a manner surrounding the pixel portion 4002, the source side driving circuit 4003, and the gate side driving circuit 4004 during this time.

Figure 18B:
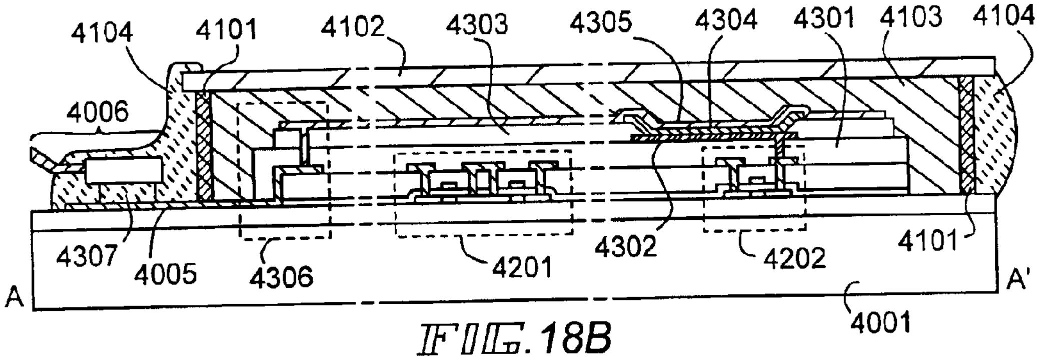

Further, FIG. 18B is a cross-sectional view taken along a line A–A' of FIG. 18A. In this figure, a drive TFT 4201 included in the source side driving circuit (an N channel TFT and a P channel TFT are shown here) and an electric current control TFT 4202 (TFT for controlling the electric current flowing to the EL device) included in the pixel portion 4002 are formed on the substrate 4001.

A TFT of the same structure as that of the P channel TFT or N channel TFT of FIG. 12 is utilized for the drive TFT 4201 and a TFT of the same structure as that of the P channel TFT of FIG. 12 is utilized for the electric current control TFT 4202 in this embodiment. Also, a capacitance storage (not shown), which is connected to the gate of the electric current control TFT 4202, is provided in the pixel portion 4002.

An interlayer insulating film 4301 (flattened film) formed of resin material is formed on the drive TFT 4201 and the pixel TFT 4202 and a pixel electrode (anode) 4302, electrically connected to the drain of the pixel TFT 4202. A transparent conductive film with a large working function is used as a pixel electrode 4302. A compound of oxide indium and oxide tin, or a compound of oxide indium and oxide zinc can be used for a transparent conductive film. A transparent conductive film doped with gallium can also be used as the above transparent conductive film.

Thereafter, an insulating film 4303 is formed on the pixel electrode 4302, then an opening portion is formed on the top of the pixel electrode 4302 and an EL (electroluminescence) layer 4304 is formed in the opening portion on the insulating film 4303. Well-known materials or inorganic EL materials can be used as the EL layer 4304. Additionally, either monomer based materials or polymer materials can be used as the organic EL materials.

It is appropriate to employ the well-known evaporation technique or the coating technique as the method for forming the EL layer 4304. This EL layer 4303 may be structured as a lamination structure or a single layer structure by freely combining an electron hole implant layer, an electron hole conveyance layer, a luminescent layer, an electron conveyance layer, and an electron implant layer.

A cathode 4305 formed of a conductive film having shielding characteristics (typically a conductive film mainly composed of aluminum, copper, or silver or a lamination film of these materials and another conductive film), is formed on the EL layer 4304. It is desirable that the moisture and oxygen existing in the interface of the cathode 4305 and EL layer 4304 be eliminated as much as possible. Therefore, the formation of the cathode 4305 and the EL layer 4304 needs contriving, that is, to form both of them both continuously in a vacuum or to form the EL layer 4304 in an atmosphere containing nitrogen or inert gas and form the cathode 4305 without exposure to moisture and oxygen. By employing a multi-chamber system (cluster tool system) of a film-forming device, this embodiment is able to form a film as described above.

Thereafter, the cathode 4305 is electrically connected to the wiring 4005 in the region indicated by reference numeral 4306. The wiring 4005 is a wiring for applying a predetermined voltage to the cathode 4305, and thus the cathode 4305 is electrically connected to the FPC 4006 via an anisotropy conductive film 4307.

The EL device (element) made up of the pixel electrode (anode) 4304, the EL layer 4303, and the cathode 4305 is formed in the way described above. This EL device (element) is wrapped by the first sealing material 4101 and the covering material 4102 which is stuck to the substrate 4001 by the first sealing material 4101, and then the EL device (element) is encapsulated by the filling material 4103.

As the covering material 4102, materials such as glass, metal (typically stainless), ceramic, and plastic (including plastic film) can be used. Materials such as an FRP (Fiberglass-Reinforced Plastics) plate, a PVF (polyvinyl fluoride) film, a mylar film, a polyester film, or an acrylic resin film can be used as plastic materials. Also, a sheet structured with an aluminum foil sandwiched in a PVF film or a mylar film can be used.

However, if light from the EL device (element) radiates in the direction of the covering material, the covering material must be transparent. In that case, transparent materials such as a sheet of glass, a sheet of plastic, polyester film, or acrylic film should be used.

Furthermore, an ultraviolet cure resin or a thermal cure resin can be use as the filling material 4103, and additionally, PVC (polyvinyl chloride), acrylic, polyimide, epoxy resin, silicone resin, PVB (polyvinyl butyral), or EVA (ethylene vinyl acetate) may be used. By providing a hygroscopic material (preferably oxide barium) or a substance that absorbs oxygen inside the filling material 4103, deterioration of the EL device (element) can be restrained.

A spacer may be included in the filling material 4103. The spacer can be hygroscopic when formed with oxide barium during this time. In the case of providing a spacer, disposing a resin film that acts as a buffer layer to ease the pressure from the spacer on the cathode 4305 is effective.

The wiring 4005 is electrically connected to the FPC 4006 via the anisotropy conductive film 4307. Signals transmitted to the pixel portion 4002, the source side driving circuit 4003, and the gate side driving circuit 4004 are conveyed by the wiring 4005 to the FPC 4006 which electrically connects the EL device (element) to an external equipment.

Moreover, this embodiment provides a second sealing material 4104 so as to cover an exposing portion of the first sealing material 4101 and a portion of the FPC 4006 resulting into a structure that completely shuts the EL device (element) from the open air. Through this process, the EL device (element) has a structure as shown in the cross-sectional view of FIG. 18B.

Embodiment 7

In this embodiment, an example of a pixel structure that can be utilized in the pixel portion of the EL display device illustrated in embodiment 6 or embodiment 8 is described with reference to FIGS. 19A to 19C. According to this embodiment, reference numerals 4601 denotes a source wiring of a switching TFT 4602, 4603 denotes a gate wiring of the switching TFT 4602, 4604 denotes an electric current control TFT, 4605 denotes a condenser (capacitor), 4606 and 4608 denote electric current supple wiring, and finally 4607 denotes an EL device (element).

Figure 19A:
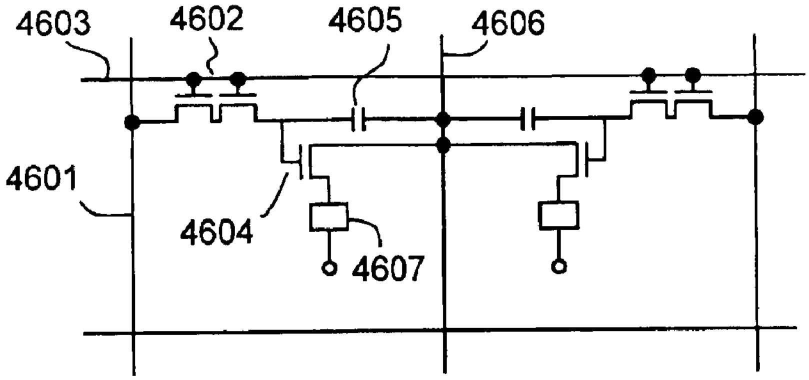
FIGS. 19A–19C are diagrams showing a circuit structure of an active matrix type EL display device.

FIG. 19A is a diagram showing an example of which the electric current supple wiring 4606 is commonly provided for two pixels. That is, the characteristic structure is that the two pixels are formed in a linearly symmetrical manner with the electric current supply wiring 4606 as a center. In this situation, since the number of lines in the electric current supply wiring can be lessened, a higher fining of the pixel portion can further be achieved.

Figure 19B:
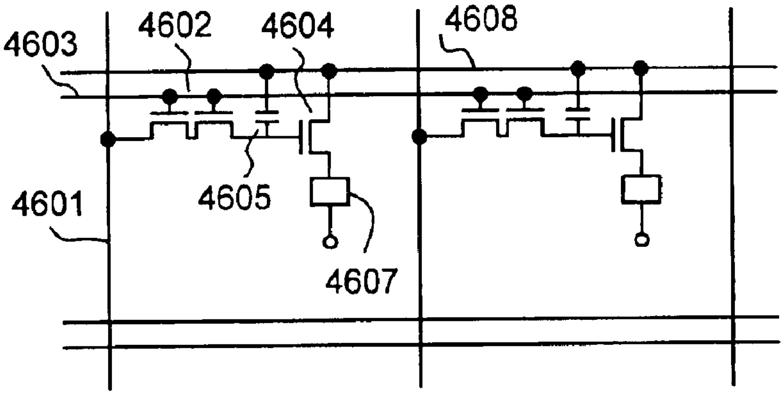

Further, FIG. 19B is a diagram showing an example of which the electric current supply wiring 4608 is provided parallel to the gate wiring 4603. In this figure, though the structure is that of the electric current supply wiring 4608 and the gate wiring 4603 being provided so as not to overlap each other, they can be set in an overlapping manner via an insulating film provided that both wiring are formed in different layers. Since the electric current supply wiring 4608 and the gate wiring 4603 are made to share an exclusive area in this situation, a higher fining of the pixel portion can further be achieved.

Figure 19C:
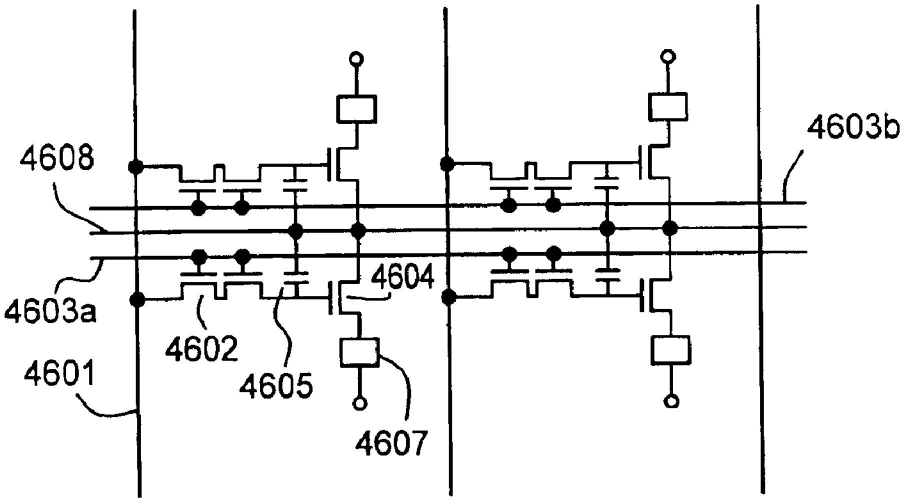

Further, similar to the structure of FIG. 19B, FIG. 19C shows the characteristic structure in which the electric current supply wiring 4608 is provided parallel to the gate wiring 4603 and further two pixels are formed in a linearly symmetric manner with the electric current supply wiring 4606 as a center. Moreover, providing the electric current supply wiring and the gate wiring 4603 in a manner where whichever one overlaps the other is effective. In this situation, since the number of lines in the electric current supply wiring is lessened, a higher fining of the pixel portion can further be achieved.

Embodiment 8

Figure 20A:
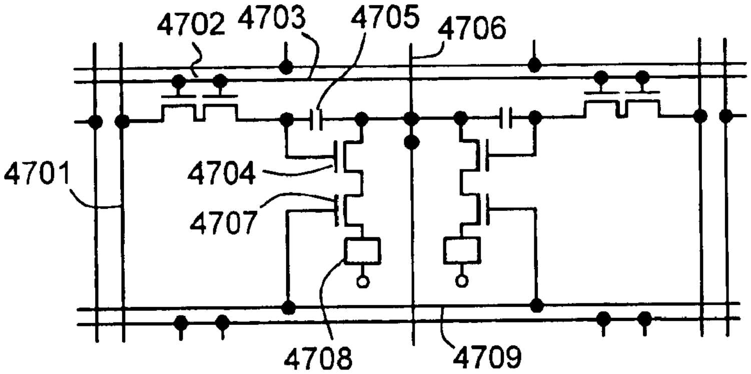
FIGS. 20A–20B are diagrams showing a circuit structure of an active matrix type EL display device.
Figure 20B:
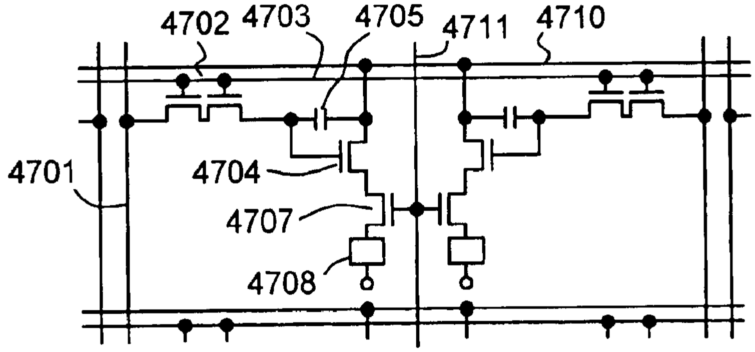

According to this embodiment, FIGS. 20A and 20B show an example of a pixel structure of an EL display device implementing the present invention. In this embodiment, reference numerals 4701 denotes a source wiring of a switching TFT 4702, 4703 denotes a gate wiring of the switching TFT 4702, 4704 denotes an electric current control TFT, 4705 denotes a condenser (capacitor) which can be omitted, 4706 denotes an electric current supply wiring, 4707 denotes a power source control TFT, 4709 denotes a gate wiring for power source control, and finally 4708 denotes an EL device. The operations of the power source control TFT 4707 can be referred in Japanese Patent Application No. Hei 11-321272.

In this embodiment, the power source control TFT 4707 is provided between the electric current control TFT 4704 and the EL element 4708 though the electric current control TFT 4704 may be provided between the power source control TFT 4707 and the EL element 4708. Also, the power source control TFT 4707 and the electric current control TFT 4704 can be of the same structure; however these are desirably formed in series on the same active layer.

Further, FIG. 20A is a diagram showing an example of which the electric current supple wiring 4706 is commonly provided for two pixels. That is, the characteristic structure is that the two pixels are formed in a linearly symmetrical manner with the electric current supply wiring 4706 as a center. In this situation, since the number of lines in the electric current supply wiring can be lessened, a higher fining of the pixel portion can further be achieved.

Furthermore, FIG. 20B is a diagram showing an example of which an electric current supply wiring 4710 is provided parallel to the gate wiring 4703 and a power source control gate wiring 4711 is provided parallel to the source wiring 4701. In this figure, though the structure is that the electric current supply wiring 4710 and the gate wiring 4703 is provided so as not to overlap each other, they can be set in an overlapping manner via an insulating film provided that both wiring are formed in different layers. Since the structure of this embodiment is able to make the electric current supply wiring 4710 and the gate wiring 4703 share an exclusive area in this situation, a higher fining of the pixel portion can further be achieved.

Embodiment 9

Figure 21A:
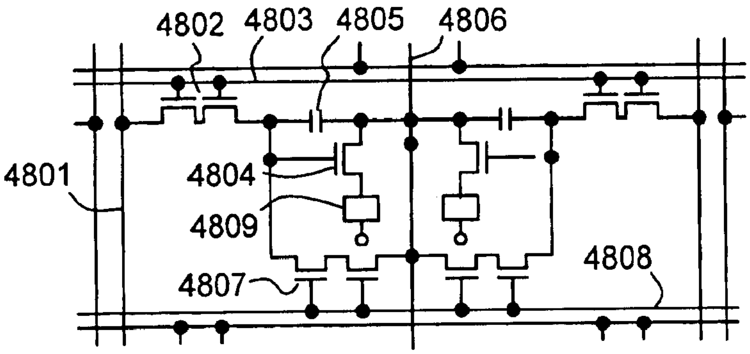
FIGS. 21A–21B are diagrams showing a circuit structure of an active matrix type EL display device.
Figure 21B:
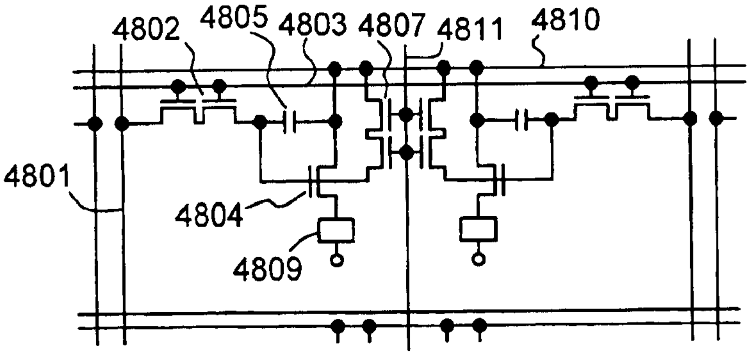

According to this embodiment, FIGS. 21A and 21B show an example of a pixel structure of an EL display device implementing the present invention. In this embodiment, reference numerals 4801 denotes a source wiring of a switching TFT 4802, 4803 denotes a gate wiring of the switching TFT 4802, 4804 denotes an electric current control TFT, 4805 denotes a condenser (capacitor) which can be omitted, 4806 denotes an electric current supply wiring, 4807 denotes an elimination TFT, 4808 denotes elimination gate wiring, and finally 4809 denotes an EL device (element). The operations of the elimination TFT 4807 can be referred in Japanese Patent Application No. Hei 11-338786.

The drain of the elimination TFT 4807 is connected to the gate of the electric current control TFT 4804, and the structure in this embodiment is able to forcibly change the gate voltage of the electric current control TFT 4804. Moreover, the elimination TFT 4807 can be an N channel TFT or a P channel TFT though it is preferred that the elimination TFT 4807 be of the same structure as that of the switching TFT 4802 in order to make the off current smaller.

Further, FIG. 21A is a diagram showing an example of which the electric current supple wiring 4806 is commonly provided for two pixels. That is, the characteristic structure is that the two pixels are formed in a linearly symmetrical manner with the electric current supply wiring 4806 as a center. In this situation, since the number of lines in the electric current supply wiring can be lessened, a higher fining of the pixel portion can further be achieved.

Furthermore, FIG. 21B is a diagram showing an example of which an electric current supply wiring 4810 is provided parallel to the gate wiring 4803 and an elimination gate wiring 4811 is provided parallel to the source wiring 4801. In this figure, though the structure is that the electric current supply wiring 4810 and the gate wiring 4803 are provided so as not to overlap each other, they can be set in an overlapping manner via an insulating film provided that both wirings are formed in different layers. Since the structure in this embodiment is able to make the electric current supply wiring 4810 and the gate wiring 4803 share an exclusive area in this situation, a higher fining of the pixel portion can further be achieved.

Embodiment 10

The EL display device according to the present invention can be so structured that the pixel may include any number of TFTs. For example, four to six or more TFTs can be provided. Implementation of the present invention is possible without being limited to the pixel structure of the EL display device.

Embodiment 11

A CMOS circuit and a pixel matrix circuit formed through carrying out the present invention may be applied to various display devices (active matrix type liquid crystal displays, active matrix type EL displays, active matrix type EC displays). Namely, the present invention may be embodied in all the electronic equipments that incorporate those display devices into display units.

As such an electronic equipment, a video camera, a digital camera, a projector (rear-type or front-type projector), a head mount display (goggle-type display), a navigation system for vehicles, a stereo for vehicles, a personal computer, and a portable information terminal (a mobile computer, a cellular phone, or an electronic book, etc.) may be enumerated. Examples of those are shown in FIGS. 22A to 24C.

Figure 22A:
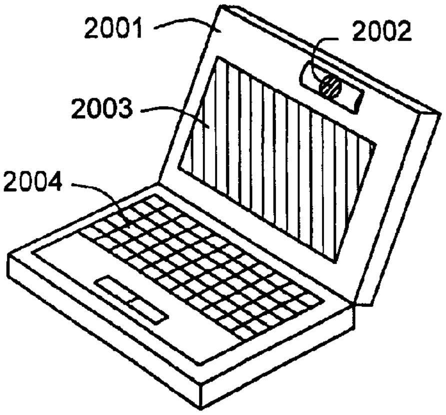
FIGS. 22A–22F shows examples of electronic equipment.

FIG. 22A shows a personal computer comprising a main body 2001, an image inputting unit 2002, a display unit 2003, and a key board 2004 and the like. The present invention is applicable to the image inputting unit 2002, the display unit 2003, and other signal control circuits.

Figure 22B:
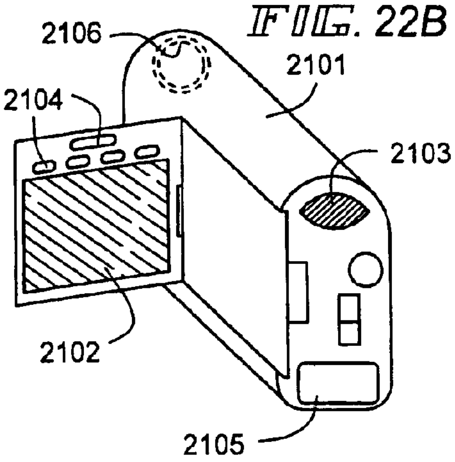

FIG. 22B shows a video camera comprising a main body 2101, a display unit 2102, a voice input unit 2103, operation switches 2104, a battery 2105, and an image receiving unit 2106 and the like. The present invention is applicable to the display unit 2102 and other signal control circuits.

Figure 22C:
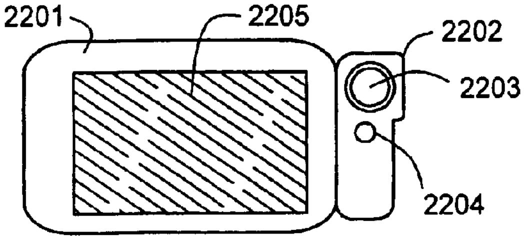

FIG. 22C shows a mobile computer comprising a main body 2201, a camera unit 2202, an image receiving unit

2203, an operation switch 2204, and a display unit 2205 and the like. The present invention is applicable to the display unit 2205 and other signal control circuits.

Figure 22D:
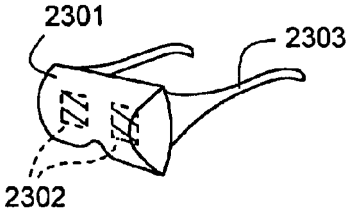

FIG. 22D shows a goggle-type display comprising a main body 2301, a display unit 2302 and arm portions 2303 and the like. The present invention is applicable to the display unit 2302 and other signal control circuits.

Figure 22E:
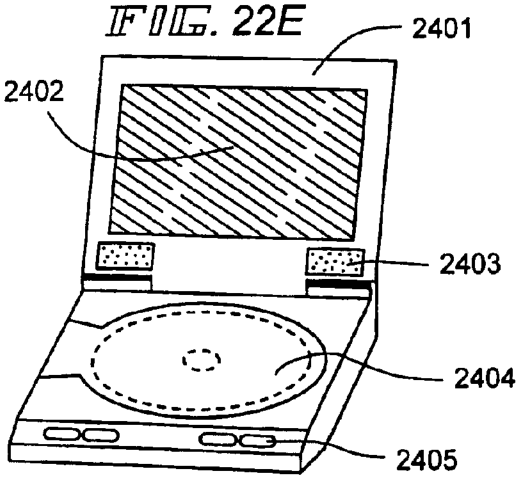

FIG. 22E shows a player that employs a recoding medium in which programs are recorded (hereinafter referred to as recording medium), and comprises a main body 2401, a display unit 2402, a speaker unit 2403, a recording medium 2404, and an operation switch 2405 and the like. Incidentally, this player uses as the recoding medium a DVD (digital versatile disc), a CD and the like to serve as a tool for enjoying music or movies, for playing video games and for connecting to the Internet. The present invention is applicable to the display unit 2402 and other signal control circuits.

Figure 22F:
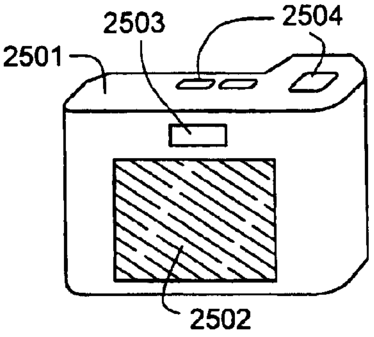

FIG. 22F shows a digital camera comprising a main body 2501, a display unit 2502, an eye piece section 2503, operation switches 2504, and an image receiving unit (not shown) and the like. The present invention is applicable to the display unit 2502 and other signal control circuits.

Figure 23A:
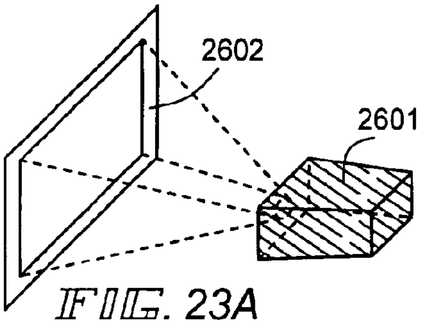
FIGS. 23A–23D show examples of electronic equipment.

FIG. 23A shows a front-type projector comprising a projection device 2601, a screen 2602 and the like. The present invention is applicable to a liquid crystal display device 2808 that constitutes a part of the projection device 2601 and other signal control circuits.

Figure 23B:
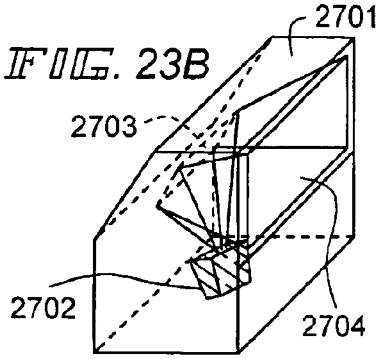

FIG. 23B shows a rear-type projector comprising a main body 2701, a projection device 2702, a mirror 2703, and a screen 2704 and the like. The present invention is applicable to the liquid crystal display device 2808 that constitutes a part of the projection device 2702 and other signal control circuits.

Figure 23C:
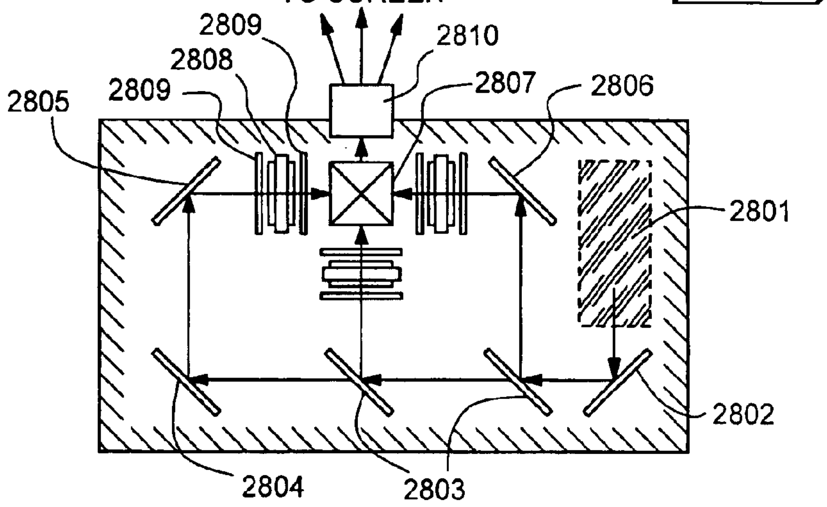

FIG. 23C is a diagram showing an example of the structure of the projection devices 2601 and 2702 in FIGS. 23A and 23B. The projection device 2601 or 2702 comprises a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 consists of an optical system including a projection lens. This embodiment shows an example of "three plate type", but not particularly limited thereto. For instance, the invention may be applied also to "single plate type". Further, in the light path indicated by an arrow in FIG. 23C, an optical system such as an optical lens, a film having a polarization function, a film for adjusting a phase difference and an IR film may be provided on discretion of a person who carries out the invention.

Figure 23D:
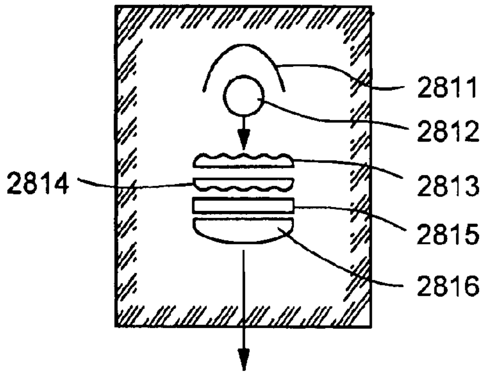

FIG. 23D is a diagram showing an example of the structure of the light source optical system 2801 in FIG. 23C. In this embodiment, the light source optical system 2801 comprises a reflector 2811, light source 2812, lens arrays 2813 and 2814, a polarization conversion element 2815, and a condenser lens 2816. The light source optical system shown in FIG. 23D is an example thereof, and is not particularly limited. For instance, on discretion of a person who carries out the invention, the light source optical system may be provided with an optical system such as an optical lens, a film having a polarization function, a film for adjusting the phase difference and an IR film.

The projector shown in FIG. 23 shows the case in which the display device of transmission type is employed and an application example using the electro-optical device of reflective type and the EL display device is not illustrated.

Figure 24A:
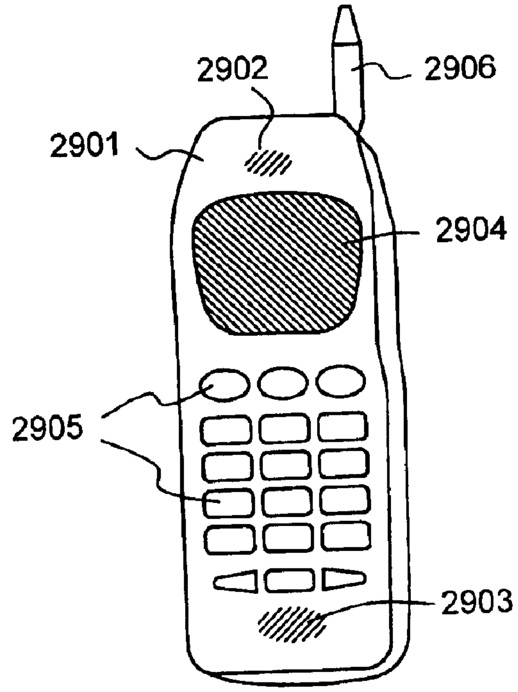
FIGS. 24A–24C shows examples of electronic equipment.

FIG. 24A is a cellular phone that is composed of a main body 2901, a voice output unit 2902, a voice input unit 2903, a display unit 2904, operation switches 2905, and an antenna 2906 and the like. The present invention can be applied to the voice output unit 2902, the voice input unit 2903 and the display unit 2904 and other signal control circuits.

Figure 24B:
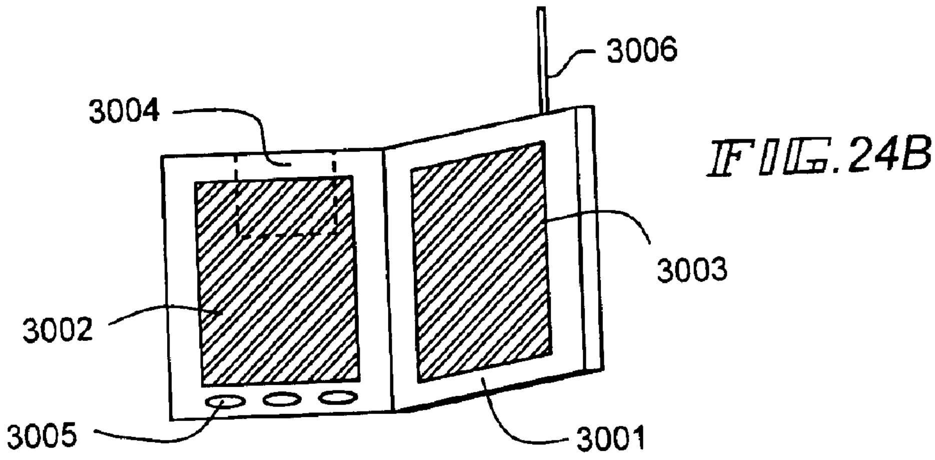

FIG. 24B shows a portable book (electronic book) that is comprised of a main body 3001, display units 3002 and 3003, a memory medium 3004, an operation switch 3005 and an antenna 3006 and the like. The present invention can be applied to the display units 3002 and 3003 and other signal circuits.

Figure 24C:
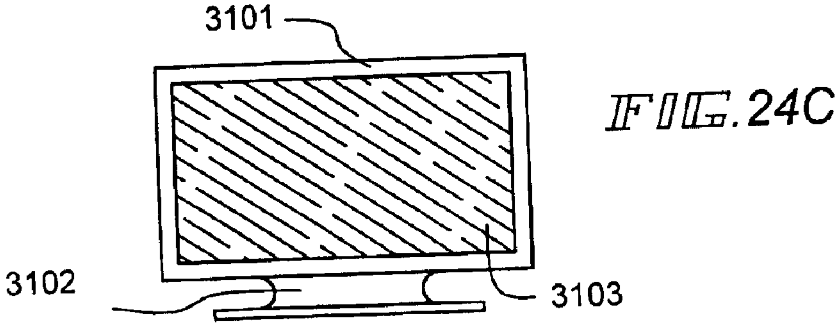

FIG. 24C shows a display that is comprised of a main body 3101, a support base 3102 and a display unit 3103 and the like. The present invention can be applied to the display unit 3103. The display according to the present invention is advantageous in the case where the display is particularly large-sized and in the case where the display is 10 inches or more in diagonal (particularly 30 inches or more).

As described above, the present invention has so wide application range that it is applicable to electronic equipments in any field. In addition, the electronic equipments of this embodiment may be realized with any construction obtained by combining Embodiments 1 to 10.

By employing the present invention, a contact hole can be formed by simultaneously performing etching once on a lamination film (a lamination film of an inorganic insulating film and an organic resin film) of different material and film thickness; hence the number of processes can be decreased.

Further, the operating efficiency and the reliability of a semiconductor device can be improved by providing a contact hole that is uniform in shape, and moreover an appropriate one.

Furthermore, the yield of an active matrix type liquid crystal display device can be improved by forming a pixel electrode of good coverage. In addition, since a fine contact hole can be formed, a detailed fining of every TFT is possible.

What is claimed is:

1. A semiconductor device comprising:

a first conductive film formed over an insulating substrate;

an inorganic insulating film covering said first conductive film;

an organic resin film covering said inorganic insulating film;

a contact hole that goes through said inorganic insulating film and said organic resin film;

an edge portion of said inorganic insulating film that comes in contact with a bottom surface of said contact hole is taper like having an angle range of 30 degrees to 80 degrees from a horizontal surface; and a second conductive film formed over said organic resin film and connected to said first conductive film at a bottom surface of said contact hole.

2. A semiconductor device according to claim 1, wherein said contact hole is formed by performing one etching.

3. A semiconductor device according to claim 1, further comprising a thin film transistor electrically connected to said first conductive film.

4. A semiconductor device according to claim 1, wherein said second conductive film is a pixel electrode.

5. A semiconductor device according to claim 1, wherein said inorganic insulating film is a silicon nitride film or a silicon oxide nitride film.

6. A semiconductor device according to claim 1, wherein said semiconductor device includes an active matrix liquid crystal display device, an active matrix EL display device or an active matrix EC display device.

7. A semiconductor device comprising:

a substrate;

a source region and a drain region which are provided over said substrate with a channel region provided over said substrate between said source region and said drain region;

a gate electrode provided over said substrate and provided adjacent to said channel region with a gate insulating film between said gate electrode and said channel region;

a wiring provided over and connected with one of said source region and said drain region;

an inorganic insulating film provided over said wiring;

an organic resin film provided over said inorganic insulating film;

a contact hole provided through said inorganic insulating film and said organic resin film;

an edge portion of said inorganic insulating film that comes in contact with a bottom surface of said contact hole is taper like having an angle range of 30 degrees to 80 degrees from a horizontal a pixel electrode provided over said organic resin film and connected with said wiring through said contact hole.

8. A semiconductor device according to claim 7, wherein said inorganic insulating film is a silicon nitride film or a silicon oxide nitride film.

9. A semiconductor device according to claim 7, wherein said semiconductor device includes an active matrix liquid crystal display device, an active matrix EL display device or an active matrix EC display device.

10. A semiconductor device comprising:

a first conductive film formed over an insulating substrate;

an inorganic insulating film covering said first conductive film;

an organic resin film covering said inorganic insulating film;

a contact hole that goes through said inorganic insulating film and said organic resin film;

an edge portion of said organic resin film that comes in contact with said inorganic insulating film has an angle range of 50 degrees to 90 degrees from a horizontal surface; and a second conductive film formed over said organic resin film and connected to said first conductive film at a bottom surface of said contact hole.

11. A semiconductor device according to claim 10, wherein said contact hole is formed by performing one etching.

12. A semiconductor device according to claim 10, further comprising a thin film transistor electrically connected to said first conductive film.

13. A semiconductor device according to claim 10, wherein said second conductive film is a pixel electrode.

14. A semiconductor device according to claim 10, wherein said inorganic insulating film is a silicon nitride film or a silicon oxide nitride film.

15. A semiconductor device according to claim 10, wherein said semiconductor device includes an active matrix liquid crystal display device, an active matrix EL display device or an active matrix EC display device.

16. A semiconductor device comprising:

a substrate;

a source region and a drain region which are provided over said substrate with a channel region provided over said substrate between said source region and said drain region;

a gate electrode provided over said substrate and provided adjacent to said channel region with a gate insulating film between said gate electrode and said channel region;

a wiring provided over and connected with one of said source region and said drain region;

an inorganic insulating film provided over said wiring;

an organic resin film provided over said inorganic insulating film;

a contact hole provided through said inorganic insulating film and said organic resin film;

an edge portion of said organic resin film that comes in contact with said inorganic insulating film has an angle range of 50 degrees to 90 degrees from a horizontal surface; and a pixel electrode provided over said organic resin film and connected with said wiring through said contact hole.

17. A semiconductor device according to claim 16, wherein said inorganic insulating film is a silicon nitride film or a silicon oxide nitride film.

18. A semiconductor device according to claim 16, wherein said semiconductor device includes an active matrix liquid crystal display device, an active matrix EL display device or an active matrix EC display device.

19. An electronic device having the semiconductor device according to claim 1.

20. An electronic device having the semiconductor device according to claim 7.

21. An electronic device having the semiconductor device according to claim 10.

22. An electronic device having the semiconductor device according to claim 16.

23. A semiconductor device according to claim 19, wherein said semiconductor device is incorporated into one selected from the group consisting of a video camera, a digital camera, a projector, a goggle-type display, a navigation system for automobiles, a personal computer, and a mobile information terminal.

24. A semiconductor device according to claim 20, wherein said semiconductor device is incorporated into one selected from the group consisting of a video camera, a digital camera, a projector, a goggle-type display, a navigation system for automobiles, a personal computer, and a mobile information terminal.

25. A semiconductor device according to claim 21, wherein said semiconductor device is incorporated into one selected from the group consisting of a video camera, a digital camera, a projector, a goggle-type display, a navigation system for automobiles, a personal computer, and a mobile information terminal.

26. A semiconductor device according to claim 22, wherein said semiconductor device is incorporated into one selected from the group consisting of a video camera, a digital camera, a projector, a goggle-type display, a navigation system for automobiles, a personal computer, and a mobile information terminal.

* * * * *

US006900462C1

(12) EX PARTE REEXAMINATION CERTIFICATE (8427th)

United States Patent

Suzawa et al.

(10) Number: US 6,900,462 C1

(45) Certificate Issued: Jul. 26, 2011

(54) SEMICONDUCTOR DEVICE AND MANUFACTURING METHOD THEREOF

(75) Inventors: Hideomi Suzawa, Kanagawa (JP); Yoshihiro Kusuyama, Kanagawa (JP)

(73) Assignee: Semiconductor Energy Laboratory Co., Ltd., Hase, Atsugi-shi, Kanagawa-ken (JP)

Reexamination Request:
No. 90/010,214, Jul. 1, 2008

Reexamination Certificate for:

| | |
|---|---|
| Patent No.: | **6,900,462** |
| Issued: | **May 31, 2005** |
| Appl. No.: | **10/683,545** |
| Filed: | **Oct. 10, 2003** |

Related U.S. Application Data

(62) Division of application No. 10/189,935, filed on Jul. 3, 2002, now Pat. No. 6,686,228, which is a continuation of application No. 09/535,835, filed on Mar. 28, 2000, now Pat. No. 6,475,836.

(30) Foreign Application Priority Data

Mar. 29, 1999 (JP) ........................................ 11087017

(51) Int. Cl.
*H01L 1/02* (2006.01)

(52) U.S. Cl. ........... 257/29; 257/E21.252; 257/E21.256; 257/E21.576; 257/E21.578; 257/E27.111

(58) Field of Classification Search .................. 438/631, 438/640, 712
See application file for complete search history.

(56) References Cited

U.S. PATENT DOCUMENTS

| | | | |
|---|---|---|---|
| 3,844,908 | A | 10/1974 | Matsuo et al. |
| 4,103,297 | A | 7/1978 | McGreivy et al. |
| 4,226,898 | A | 10/1980 | Ovshinsky et al. |
| 4,239,346 | A | 12/1980 | Lloyd |
| 4,254,426 | A | 3/1981 | Pankove |
| 4,342,617 | A | 8/1982 | Fu et al. |
| 4,448,491 | A | 5/1984 | Okubo |
| 4,523,370 | A | 6/1985 | Sullivan et al. |
| 4,557,036 | A | 12/1985 | Kyuragi et al. |
| 4,597,637 | A | 7/1986 | Ohta |

(Continued)

FOREIGN PATENT DOCUMENTS

| | | | |
|---|---|---|---|
| CN | 1090062 | | 7/1994 |
| EP | 0 221 531 | A2 | 5/1987 |
| EP | 0 376 648 | A3 | 7/1990 |
| EP | 0 603 866 | A1 | 6/1994 |
| EP | 0 655 774 | A2 | 5/1995 |
| EP | 0 661 581 | B1 | 7/1995 |
| EP | 0 689 085 | B1 | 12/1995 |
| EP | 0 708 356 | B1 | 4/1996 |
| EP | 1 179 381 | A2 | 2/2002 |
| FR | 263220 | * | 10/1986 |

(Continued)

OTHER PUBLICATIONS

Hayashi, H. et al., "Fabrication of Low–Temperature Bottom–Gate Poly–SI TFTS on Large–Area Substrate by Linear–Beam Excirner Laser Crystallization and Ion Doping Method," IEDM 95: Technical Digest of International Electron Devices Meeting, 1995, pp. 33.3.1–33.3.4(829–832).

(Continued)

*Primary Examiner*—P. Tibbits

(57) ABSTRACT

It is an object of the present invention to provide a manufacturing method of semiconductor device whereby the number of processes is decreased due to simultaneously forming a contact hole in a lamination film of different material and film thickness (inorganic insulating film and organic resin film) by conducting etching once. By setting the selective ratio of dry etching (etching rate of organic resin film 503/ etching rate of inorganic insulating film 502 containing nitrogen) from 1.6 to 2.9, preferably 1.9, the shape and the size of the contact holes to be formed even in a film of different material and film thickness can be nearly the same in both of the contact holes.

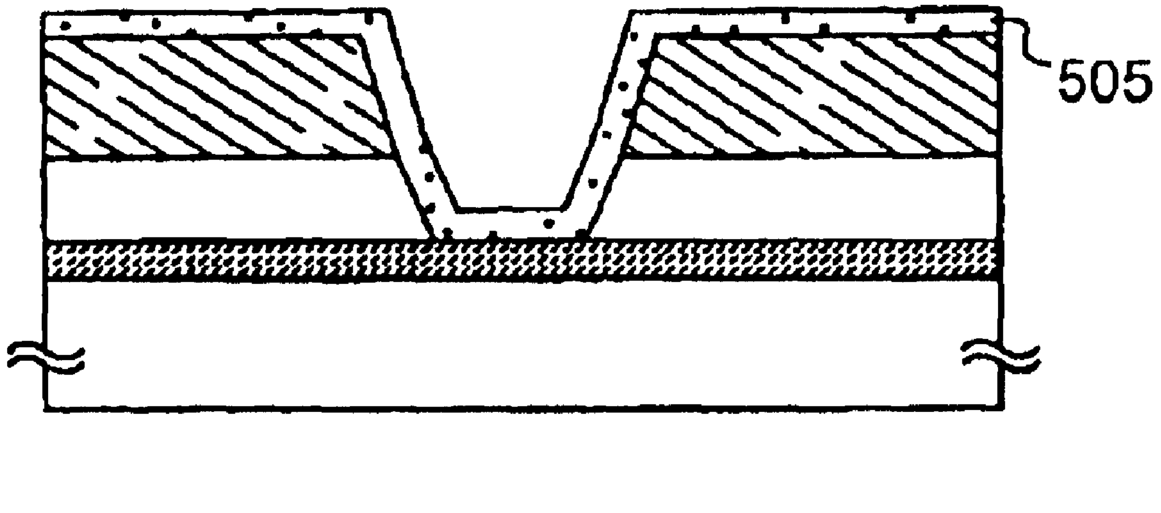

U.S. PATENT DOCUMENTS 4,618,878 A 10/1986 Aoyama et al.
4,650,922 A 3/1987 McPherson
4,680,580 A 7/1987 Kawahara
4,705,358 A 11/1987 Yamazaki et al.
4,722,913 A 2/1988 Miller
4,759,610 A 7/1988 Yanagisawa
4,800,174 A 1/1989 Ishihara et al.
4,804,490 A 2/1989 Pryor et al.
4,814,041 A * 3/1989 Auda ......................... 438/712
4,818,077 A 4/1989 Ohwada et al.
4,845,533 A 7/1989 Pryor et al.
4,853,760 A 8/1989 Abe et al.
4,864,376 A 9/1989 Aoki et al.
4,869,755 A 9/1989 Huschka et al.
4,938,565 A 7/1990 Ichikawa
4,949,141 A 8/1990 Busta
4,972,250 A 11/1990 Omori et al.
5,003,356 A 3/1991 Wakai et al.
5,012,228 A 4/1991 Masuda et al.
5,051,570 A 9/1991 Tsujikawa et al.
5,055,899 A 10/1991 Wakai et al.
5,056,895 A 10/1991 Kahn
5,066,110 A 11/1991 Mizushima et al.
5,084,905 A 1/1992 Sasaki et al.
5,091,334 A 2/1992 Yamazaki et al.
5,101,288 A 3/1992 Ohta et al.
5,117,278 A 5/1992 Bellersen et al.
5,117,299 A 5/1992 Kondo et al.
5,132,821 A 7/1992 Nicholas
5,166,085 A 11/1992 Wakai et al.
5,176,791 A 1/1993 Itoh et al.
5,196,954 A 3/1993 Yamazaki et al.
5,200,846 A 4/1993 Hiroki et al.
5,206,183 A 4/1993 Dennison
5,227,900 A 7/1993 Inaba et al.
5,229,644 A 7/1993 Wakai et al.
5,233,211 A 8/1993 Hayashi et al.
5,235,195 A 8/1993 Tran et al.
5,250,451 A 10/1993 Chouan
5,286,659 A 2/1994 Mitani et al.
5,287,205 A 2/1994 Yamazaki et al.
5,289,016 A 2/1994 Noguchi
5,306,651 A 4/1994 Masumo et al.
5,327,001 A 7/1994 Wakai et al.
5,330,616 A 7/1994 Yamazaki
5,371,398 A 12/1994 Nishihara
5,392,143 A 2/1995 Akiyama et al.
5,414,547 A 5/1995 Matsuo et al.
5,422,658 A 6/1995 Kawaguchi et al.
5,432,527 A 7/1995 Yanai et al.
5,453,406 A 9/1995 Chen
5,453,858 A 9/1995 Yamazaki
5,461,501 A 10/1995 Sato et al.
5,474,941 A 12/1995 Mitani et al.
5,481,121 A * 1/1996 Zhang et al. .................. 257/64
5,488,000 A 1/1996 Zhang et al.
5,495,353 A 2/1996 Yamazaki et al.
5,499,123 A 3/1996 Mikoshiba
5,500,538 A 3/1996 Yamazaki et al.
5,501,739 A 3/1996 Yamada et al.
5,514,879 A 5/1996 Yamazaki
5,529,951 A 6/1996 Noguchi et al.
5,536,950 A 7/1996 Liu et al.
5,550,066 A 8/1996 Tang et al.
5,568,288 A 10/1996 Yamazaki et al.
5,572,046 A 11/1996 Takemura
5,583,369 A 12/1996 Yamazaki et al.
5,585,951 A 12/1996 Noda et al.
5,604,380 A 2/1997 Nishimura et al.
5,612,799 A 3/1997 Yamazaki et al.
5,614,732 A 3/1997 Yamazaki
5,621,556 A 4/1997 Fulks et al.
5,641,974 A 6/1997 den Boer et al.
5,652,029 A 7/1997 Itoh
5,654,203 A 8/1997 Ohtani et al.
5,684,365 A 11/1997 Tang et al.
5,686,328 A 11/1997 Zhang et al.
5,686,980 A 11/1997 Hirayama et al.
5,696,386 A 12/1997 Yamazaki
5,701,167 A 12/1997 Yamazaki
5,705,829 A 1/1998 Miyanaga et al.
5,706,067 A 1/1998 Colgan et al.
5,712,495 A 1/1998 Suzawa
5,714,968 A 2/1998 Ikeda
5,717,224 A 2/1998 Zhang
5,721,601 A 2/1998 Yamaji et al.
5,724,107 A 3/1998 Nishikawa et al.
5,731,628 A 3/1998 Terashima
5,739,549 A 4/1998 Takemura et al.
5,747,830 A 5/1998 Okita
5,748,165 A 5/1998 Kubota et al.
5,751,381 A 5/1998 Ono et al.
5,763,899 A 6/1998 Yamazaki et al.
5,766,696 A 6/1998 Itoh
5,777,701 A 7/1998 Zhang
5,784,201 A 7/1998 Lee et al.
5,808,315 A 9/1998 Murakami et al.
5,815,223 A 9/1998 Watanabe et al.
5,815,231 A 9/1998 Nishi et al.
5,818,550 A 10/1998 Kadota et al.
5,820,947 A 10/1998 Itoh
5,821,138 A 10/1998 Yamazaki et al.
5,837,619 A 11/1998 Adachi et al.
5,841,195 A 11/1998 Lin et al.
5,844,254 A 12/1998 Manning et al.
5,847,410 A 12/1998 Nakajima
5,849,043 A 12/1998 Zhang et al.
5,849,601 A 12/1998 Yamazaki
5,851,862 A 12/1998 Ohtani et al.
5,856,689 A 1/1999 Suzawa
5,859,445 A 1/1999 Yamazaki
5,869,363 A 2/1999 Yamazaki et al.
5,869,803 A 2/1999 Noguchi et al.
5,871,847 A 2/1999 Itoh
5,879,741 A 3/1999 Itoh
5,899,547 A 5/1999 Yamazaki et al.
5,905,555 A 5/1999 Yamazaki et al.
5,926,242 A 7/1999 Kataoka et al.
5,933,205 A 8/1999 Yamazaki et al.
5,940,053 A 8/1999 Ikeda
5,940,732 A 8/1999 Zhang ........................ 438/640
5,943,107 A 8/1999 Kadota et al.
5,946,059 A 8/1999 Yamazaki et al.
5,963,278 A 10/1999 Yamazaki et al.
5,966,193 A 10/1999 Zhang et al.
5,989,672 A 11/1999 Hayashi
5,990,491 A 11/1999 Zhang
5,990,542 A 11/1999 Yamazaki
5,995,189 A 11/1999 Zhang
6,001,431 A 12/1999 Itoh et al.
6,005,648 A 12/1999 Zhang et al.
6,011,277 A 1/2000 Yamazaki
6,011,529 A 1/2000 Ikeda
6,023,075 A 2/2000 Yamazaki
6,055,034 A 4/2000 Zhang et al.

| | | | | |
|---|---|---|---|---|
| 6,071,765 | A | 6/2000 | Noguchi et al. | |
| 6,075,580 | A | 6/2000 | Kouchi | |
| 6,097,459 | A | 8/2000 | Shimada et al. | |
| 6,110,542 | A | 8/2000 | Miyanaga et al. | |
| 6,114,715 | A | 9/2000 | Hamada | |
| 6,133,073 | A | 10/2000 | Yamazaki et al. | |
| 6,163,055 | A | 12/2000 | Hirakata et al. | |
| 6,165,582 | A | 12/2000 | Hayashi | |
| 6,171,674 | B1 | 1/2001 | Yamazaki et al. | |
| 6,183,816 | B1 | 2/2001 | Yamazaki et al. | |
| 6,194,047 | B1 | 2/2001 | Hayashi | |
| 6,204,101 | B1 | 3/2001 | Yamazaki et al. | |
| 6,207,281 | B1 | 3/2001 | Itoh | |
| 6,217,661 | B1 | 4/2001 | Hirose et al. | |
| 6,224,952 | B1 | 5/2001 | Itoh | |
| 6,249,330 | B1 | 6/2001 | Yamaji et al. | |
| 6,249,333 | B1 | 6/2001 | Zhang et al. | |
| 6,252,249 | B1 | 6/2001 | Yamazaki | |
| 6,252,297 | B1 | 6/2001 | Kemmochi et al. | |
| 6,258,434 | B1 | 7/2001 | Hayashi | |
| 6,261,634 | B1 | 7/2001 | Itoh | |
| 6,265,070 | B1 | 7/2001 | Itoh | |
| 6,268,695 | B1 | 7/2001 | Affinito | |
| 6,281,520 | B1 | 8/2001 | Yamazaki | |
| 6,294,799 | B1 | 9/2001 | Yamazaki et al. | 257/72 |
| 6,323,918 | B1 | 11/2001 | Yoshioka et al. | |
| 6,331,475 | B1 | 12/2001 | Yamazaki et al. | |
| 6,399,988 | B1 | 6/2002 | Yamazaki | |
| 6,423,383 | B1 | 7/2002 | Hirose et al. | |
| 6,441,468 | B1 | 8/2002 | Yamazaki | |
| 6,445,059 | B1 | 9/2002 | Yamazaki | |
| 6,468,617 | B1 | 10/2002 | Yamazaki et al. | |
| 6,501,097 | B1 | 12/2002 | Zhang | |
| 6,596,990 | B2 | 7/2003 | Kasten et al. | |
| 6,621,535 | B1 | 9/2003 | Fukada | |
| 6,635,900 | B1 | 10/2003 | Yamazaki et al. | |
| 6,690,031 | B1 | 2/2004 | Ohtani et al. | 257/71 |
| 6,740,599 | B2 | 5/2004 | Yamazaki et al. | 438/739 |
| 6,787,887 | B2 | 9/2004 | Yamazaki | |
| 6,800,875 | B1 | 10/2004 | Yamazaki | |
| 6,867,434 | B2 | 3/2005 | Yamazaki | |
| 6,900,462 | B2 | 5/2005 | Suzawa et al. | |
| 6,927,826 | B2 | 8/2005 | Yamazaki | |
| 6,972,263 | B2 | 12/2005 | Yamazaki et al. | 438/713 |
| 6,982,768 | B2 | 1/2006 | Ohori et al. | |
| 7,034,381 | B2 | 4/2006 | Yamazaki | |
| 7,190,428 | B2 | 3/2007 | Yamazaki | |
| 7,202,551 | B2 | 4/2007 | Yamazaki | |
| 2001/0018097 | A1 | 8/2001 | Itoh | |
| 2002/0117736 | A1 | 8/2002 | Yamazaki et al. | |
| 2005/0082529 | A1 | 4/2005 | Yamazaki | |
| 2005/0287722 | A1 | 12/2005 | Zhang | 438/149 |
| 2006/0060861 | A1 | 3/2006 | Yamazaki et al. | 257/72 |
| 2006/0163576 | A1 | 7/2006 | Yamazaki | |
| 2007/0173058 | A1 | 7/2007 | Yamazaki | |
| 2007/0263133 | A1 | 11/2007 | Yamazaki | |

FOREIGN PATENT DOCUMENTS

| | | | | |
|---|---|---|---|---|
| GB | 2 274 723 | A | | 8/1994 |
| JP | 52-4496 | | | 2/1977 |
| JP | 52-5010 | | | 2/1977 |
| JP | 55-32026 | | | 3/1980 |
| JP | 55-107270 | | | 8/1980 |
| JP | 57-20778 | | | 2/1982 |
| JP | 58-2871 | | | 1/1983 |
| JP | 58-145134 | | | 8/1983 |
| JP | 59-72745 | | | 4/1984 |
| JP | 59-172627 | | | 9/1984 |
| JP | 60-145375 | | | 7/1985 |
| JP | 61-59473 | | | 3/1986 |
| JP | 61-141174 | | | 6/1986 |
| JP | 61-204933 | | | 9/1986 |
| JP | 61-223721 | | | 10/1986 |
| JP | 61-244068 | | | 10/1986 |
| JP | 62-278537 | | | 12/1987 |
| JP | 62-293238 | | | 12/1987 |
| JP | 63-15461 | | | 1/1988 |
| JP | 63104338 | | * | 5/1988 |
| JP | 63-284522 | | | 11/1988 |
| JP | 63-292114 | | | 11/1988 |
| JP | 1-124824 | | | 5/1989 |
| JP | 1-156725 | | | 6/1989 |
| JP | 1-183854 | | | 7/1989 |
| JP | 1-155025 | | | 10/1989 |
| JP | 1-283839 | | | 11/1989 |
| JP | 2-25024 | | | 1/1990 |
| JP | 2-111054 | | | 4/1990 |
| JP | 2-144525 | | | 6/1990 |
| JP | 2-171721 | | | 7/1990 |
| JP | 2-179615 | | | 7/1990 |
| JP | 2-234134 | | | 9/1990 |
| JP | 2-263474 | | | 10/1990 |
| JP | 3-159250 | | | 7/1991 |
| JP | 3-185425 | | | 8/1991 |
| JP | 3-72711 | | | 11/1991 |
| JP | 4-86601 | | | 3/1992 |
| JP | 4-87341 | | | 3/1992 |
| JP | 4-125683 | | | 4/1992 |
| JP | 4-27690 | | | 5/1992 |
| JP | 4-27691 | | | 5/1992 |
| JP | 4-142740 | | | 5/1992 |
| JP | 04-155834 | | | 5/1992 |
| JP | 4-177873 | | | 6/1992 |
| JP | 4-220626 | | | 8/1992 |
| JP | 4-226040 | | | 8/1992 |
| JP | 4-242724 | | | 8/1992 |
| JP | 4-269837 | | | 9/1992 |
| JP | 5-275373 | | | 10/1992 |
| JP | 5-2187 | | | 1/1993 |
| JP | 5-34723 | | | 2/1993 |
| JP | 5-224197 | | | 9/1993 |
| JP | 5-235350 | | | 9/1993 |
| JP | 5-241201 | | | 9/1993 |
| JP | 5-259891 | | | 10/1993 |
| JP | 5-275373 | | | 10/1993 |
| JP | 5-315360 | | | 11/1993 |
| JP | 6-11728 | | | 1/1994 |
| JP | 6-67009 | | | 3/1994 |
| JP | 6-138484 | | | 5/1994 |
| JP | 6-148684 | | | 5/1994 |
| JP | 6-160875 | | | 6/1994 |
| JP | 06175156 | | * | 6/1994 |
| JP | 6-175156 | | | 6/1994 |
| JP | 6-177383 | | | 6/1994 |
| JP | 6-186578 | | | 7/1994 |
| JP | 6-222390 | | | 8/1994 |
| JP | 6-242433 | | | 9/1994 |
| JP | 6-275645 | | | 9/1994 |
| JP | 6-301052 | | | 10/1994 |
| JP | 7-56190 | | | 3/1995 |
| JP | 7-58107 | | | 3/1995 |
| JP | 7-64110 | | | 3/1995 |
| JP | 7-99324 | | | 4/1995 |
| JP | 7-128685 | | | 5/1995 |
| JP | 7-128688 | | | 5/1995 |
| JP | 7-140485 | | | 6/1995 |
| JP | 7-146491 | | | 6/1995 |
| JP | 7-211635 | | | 8/1995 |
| JP | 7-234421 | | | 9/1995 |
| JP | 7-235490 | | | 9/1995 |
| JP | 8-6071 | | | 1/1996 |
| JP | 8-54836 | | | 2/1996 |

| | | |
|---|---|---|
| JP | 8-68990 | 3/1996 |
| JP | 8-122824 | 5/1996 |
| JP | 8-279615 | 10/1996 |
| JP | 9-90425 | 4/1997 |
| JP | 9-197390 | 7/1997 |
| JP | 9-311342 | 12/1997 |
| JP | 10-10578 | 1/1998 |
| JP | 10-31235 | 2/1998 |
| JP | 10-268360 | 10/1998 |
| JP | 11-52 | 3/1999 |

OTHER PUBLICATIONS

Kim, C.W. et al., "4.4: Planarized Black Matrix on TFT Structure for TFT–LCD Monitors," SID Digest '97: SID International Symposium Digest of Technical Papers, 1997, pp. 19–22.
Zelez, J., "A Diamond–Like Carbon Film," RCA Review, vol. 43, Dec. 1, 1982, pp. 665–674.

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 4, 10-18, 21, 22, 25 and 26 are cancelled.

Claims 1 and 7 are determined to be patentable as amended.

Claims 2, 3, 5, 6, 8, 9, 19, 20, 23 and 24 were not reexamined.

1. A semiconductor device comprising:

a first conductive film formed over an insulating substrate;

an inorganic insulating film covering said first conductive film;

an organic resin film covering said inorganic insulating film;

a contact hole that goes through said inorganic insulating film and said organic resin film;

an edge portion of said inorganic insulating film that comes in contact with a bottom surface of said contact hole is taper like having an angle range of 30 degrees to 80 degrees from a horizontal surface;[and]

*an edge portion of said organic resin film that comes in contact with said inorganic insulating film has an angle range of 50 degrees to 90 degrees from a horizontal surface; and* a [second conductive film] *pixel electrode* formed over said organic resin film and connected to said first conductive film at a bottom surface of said contact hole.

7. A semiconductor device comprising:

a substrate;

a source region and a drain region which are provided over said substrate with a channel region provided over said substrate between said source region and said drain region;

a gate electrode provided over said substrate and provided adjacent to said channel region with a gate insulating film between said gate electrode and said channel region;

a wiring provided over and connected with one of said source region and said drain region;

an inorganic insulating film provided over said wiring;

an organic resin film provided over said inorganic insulating film;

a contact hole provided through said inorganic insulating film and said organic resin film;

an edge portion of said inorganic insulating film that comes in contact with a bottom surface of said contact hole is taper like having an angle range of 30 degrees to 80 degrees from a horizontal surface; [and]

*an edge portion of said organic resin film that comes in contact with said inorganic insulating film has an angle range of 50 degrees to 90 degrees from a horizontal surface; and* a pixel electrode provided over said organic resin film and connected with said wiring through said contact hole.

* * * * *